(12) United States Patent
Nishio et al.

(10) Patent No.: US 7,051,225 B2
(45) Date of Patent: May 23, 2006

(54) MEMORY SYSTEM, MODULE AND REGISTER

(75) Inventors: Yoji Nishio, Tokyo (JP); Kayoko Shibata, Tokyo (JP); Seiji Funaba, Tokyo (JP)

(73) Assignee: Elpida Memory Inc. (JP)

( * ) Notice: Subject to any disclaimer, the term of this patent is extended or adjusted under 35 U.S.C. 154(b) by 484 days.

(21) Appl. No.: 10/427,090

(22) Filed: Apr. 30, 2003

(65) Prior Publication Data

US 2003/0221044 A1 Nov. 27, 2003

(30) Foreign Application Priority Data

May 22, 2002 (JP) ............................... 2002-147486

(51) Int. Cl.
*G06F 1/04* (2006.01)
(52) U.S. Cl. ...................... 713/401; 713/503; 713/600
(58) Field of Classification Search ........ 713/400–501, 713/503, 600
See application file for complete search history.

(56) References Cited

U.S. PATENT DOCUMENTS

| | | | |
|---|---|---|---|
| 5,883,736 A | 3/1999 | Oshima et al. ............. | 359/334 |
| 6,397,494 B1* | 6/2002 | Slangen ....................... | 365/63 |
| 6,438,066 B1* | 8/2002 | Ooishi et al. ................ | 365/233 |
| 6,549,484 B1* | 4/2003 | Morita et al. ................ | 365/233 |

(Continued)

FOREIGN PATENT DOCUMENTS

EP 0585005 A1 3/1994

(Continued)

OTHER PUBLICATIONS

European Search Report dated Jul. 6, 2005.

(Continued)

*Primary Examiner*—Dennis M. Butler
(74) *Attorney, Agent, or Firm*—Ostrolenk, Faber, Gerb & Soffen, LLP

(57) ABSTRACT

Disclosed are a memory command address system and a memory module that can be operated not only for 266 MHzCLK but also for 200 MHzCLK, in which clock timings in the input sections of a PLL, a register, and a DRAM are matched to one another, a DLL (delay locked loop) is provided in the register, the output timing of CA signal from the register is controlled so that the setup time margin and the hold time margin of the CA signal with respect to the clock signal with the additional latency in the DRAM=1.5 or 2.0 are equated to each other, such that clock operation of 266 MHz, for example, is made possible. If both 266 MHz and 200 MHz are used, by taking account of the timing budget, control is made for retarding the timing of the CA signal input to the flip-flop which receives an internal clock signal (intCLK) supplied to the flip-flop for determining the CA signal output timing from the register. Alternatively, control is made for switching between the replica (replical) provided in the register and an output unit associated with the replica, depending on the frequency being used, so as to cope with both frequencies simply by providing one sort of the module and one sort of the register.

40 Claims, 15 Drawing Sheets

U.S. PATENT DOCUMENTS 6,605,969 B1 * 8/2003 Mikhalev et al. ............ 327/158
6,707,726 B1 * 3/2004 Nishio et al. ........... 365/189.12
6,742,098 B1 * 5/2004 Halbert et al. ............... 711/172

FOREIGN PATENT DOCUMENTS

| EP | 1143645 A2 | 10/2001 |
|---|---|---|
| JP | P2001-093300 A | 4/2001 |
| JP | P2001-351380 A | 12/2001 |
| JP | P2002-133867 A | 5/2002 |
| JP | P2003-044349 A | 2/2003 |
| JP | P2003-44350 A | 2/2003 |
| JP | P2004-070800 A | 3/2004 |

OTHER PUBLICATIONS

Untranslated Office Action issued by Japanese Patent Office on Jul. 26, 2005 in connection with corresponding Japanese application no. 2002-147486.

English translation of relevant portion of Examiner's comments in Japanese Office Action issued Jul. 26, 2005 submitted in lieu of statement of relevancy of prior art to present invention.

* cited by examiner

FIG. 4    Timing budget @ DRAMs

| Timing Parameters | Description | 266MHz CLK | 200MHz CLK |
|---|---|---|---|
| tJ,CLKp | Timing Budget | <1875 | <2500 |
|  | CLK jitter for PLL | 75 | 75 |
| tSkew,CLKd | Channel Effect of CLK on module | 10 | 10 |
| tDuty,CLK | Duty Cycle Error of CLK | 35 | 35 |
| tQR | CA Access Time Variation of Register | 560 | 560 |
| tSkew,PD | Propagation Delay Skew b/w the Delay Replica 2 and the Local CA Bus, avg | 100 | 100 |
| ΔtPD | tSkew between DRAMs | 323 | 323 |
| Δt,PLL | PLL phase error, pin to pin, jitter | 0+50+50 | 0+50+50 |
| tFL | Flight time estimation error | 0 | 0 |
| tS/tH | tS/tH of the DRAM | 510 | 510 |
| tSkew,All | Sum of all Skew | 1713 | 1713 |
| tM | Performance Reliability Margin | 162 | 787 |

FIG. 5  Timing budget @ FF1 of Register

| Timing Parameters | Description | 266MHz CLK | 200MHz CLK |
|---|---|---|---|
| | Timing Budget | <1875 | <2500 |
| tJ,CLKp | CLK jitter for PLL | 75 | 75 |
| Δt,PLL | PLL phase error, pin to pin, jitter | 50+50+50 | 50+50+50 |
| tFBFL | Feedback + flight time estimation error | 50 | 50 |
| tQ,CS | CA skew of Chipset | 400 | 400 |
| tCE,MB | Channel Effect of Global CA Bus | 100 | 100 |
| ΔtRCV | Delay Difference between CAin Rcv & CLK Rcv | 50 | 50 |
| tSkew,CLKint | CLKint Distribution error | 50 | 50 |
| tS/tH,FF1 | intrinsic tS/tH of FF1 in Register | 100 | 100 |
| | | | |
| tSkew,All | Sum of all Skew | 975 | 975 |
| tM | Performance Reliability Margin | 900 | 1525 |

FIG. 6

Timing budget @ FF2 of Register

| Timing Parameters | Description | 266MHz CLK | | 200MHz CLK | |
|---|---|---|---|---|---|
| | | Setup | Hold | Setup | Hold |
| | Timing Budget | <5625 | >1875 | <7500 | >2500 |
| tJ,CLKp | CLK jitter for PLL | 75 | -75 | 75 | -75 |
| tDuty,CLK | Duty Cycle Error of CLK | 35 | -35 | 35 | -35 |
| Δt,PLL | PLL phase error, pin to pin, jitter | 0+0+100 | -(0+0+100) | 0+0+100 | -(0+0+100) |
| tFLFB | Feedback + flight time estimation error | 50-50=0 | 50-50=0 | 50-50=0 | 50-50=0 |
| CA delay A | CLK Rcv delay + FF1 delay + α | 600+100 +600 | 400+60 +400 | 600+100 +600 | 400+60 +400 |
| tReplica1,2 | Replica 1 + 2 delay time | 3500 | 2300 | 3500 | 2300 |
| tS/tH,FF2 | tS/tH of FF2 in Register | 350 | -350 | 350 | -350 |
| tSkew,All | Sum of all Skew | 5360 | 2600 | 5360 | 2600 |
| tM | Performance Reliability Margin | 265 | 725 | 2140 | 100 |

FIG. 9    Timing budget @ DRAMs

| Timing Parameters | Description | 266MHz CLK | 200MHz CLK |
|---|---|---|---|
| tJ,CLKp | Timing Budget | <1875 | <2500 |
| | CLK jitter for PLL | 75 | 75 |
| tSkew,CLKd | Channel Effect of CLK on module | 10 | 10 |
| tDuty,CLK | Duty Cycle Error of CLK | 35 | 35 |
| tQR | CA Access Time Variation of Register | 560 | 560 |
| tSkew,PD | Propagation Delay Skew b/w the Delay Replica 2 and the Local CA Bus,avg | 100 | 100 |
| ΔtPD | tSkew between DRAMs | 323 | 323 |
| Δt,PLL | PLL phase error, pin to pin, jitter | 0+50+50 | 0+50+50 |
| tFL | Flight time estimation error | 0 | 0 |
| tS/tH | tS/tH of the DRAM | 510 | 510 |
| tSkew,All | Sum of all Skew | 1713 | 1713 |
| tM | Performance Reliability Margin | 162 | 787 |

FIG. 10

Timing budget @ Register

| Timing Parameters | Description | 266MHz CLK | | 200MHz CLK | |
|---|---|---|---|---|---|
| | | Setup | Hold | Setup | Hold |
| tJ,CLKp | Timing Budget | <5625 | >1875 | <7500 | >2500 |
| tJ,CLKp | CLK jitter for PLL | 75 | -75 | 75 | -75 |
| tDuty,CLK | Duty Cycle Error of CLK | 35 | -35 | 35 | -35 |
| Δt,PLL | PLL phase error, pin to pin, jitter | 50+50+50 | -(50+50+50) | 50+50+50 | -(50+50+50) |
| tFLFB | Feedback + flight time estimation error | 50 | -50 | 50 | -50 |
| tQ,CS | CA skew of Chipset | 400 | -400 | 400 | -400 |
| tCE,MB | Channel Effect of Global CA Bus | 100 | -100 | 100 | -100 |
| CA delay B | CLK Rcv delay + α | 600+800 | 400+550 | 600+800 | 400+550 |
| tReplica1,2 | Replica 1 + 2 delay time | 3000 | 2150 | 4000 | 2800 |
| tS/tH,FF2 | tS/tH of FF in Register | 350 | -350 | 350 | -350 |
| tSkew,All | Sum of all Skew | 5560 | 1940 | 6560 | 2590 |
| tM | Performance Reliability Margin | 65 | 65 | 940 | 90 |

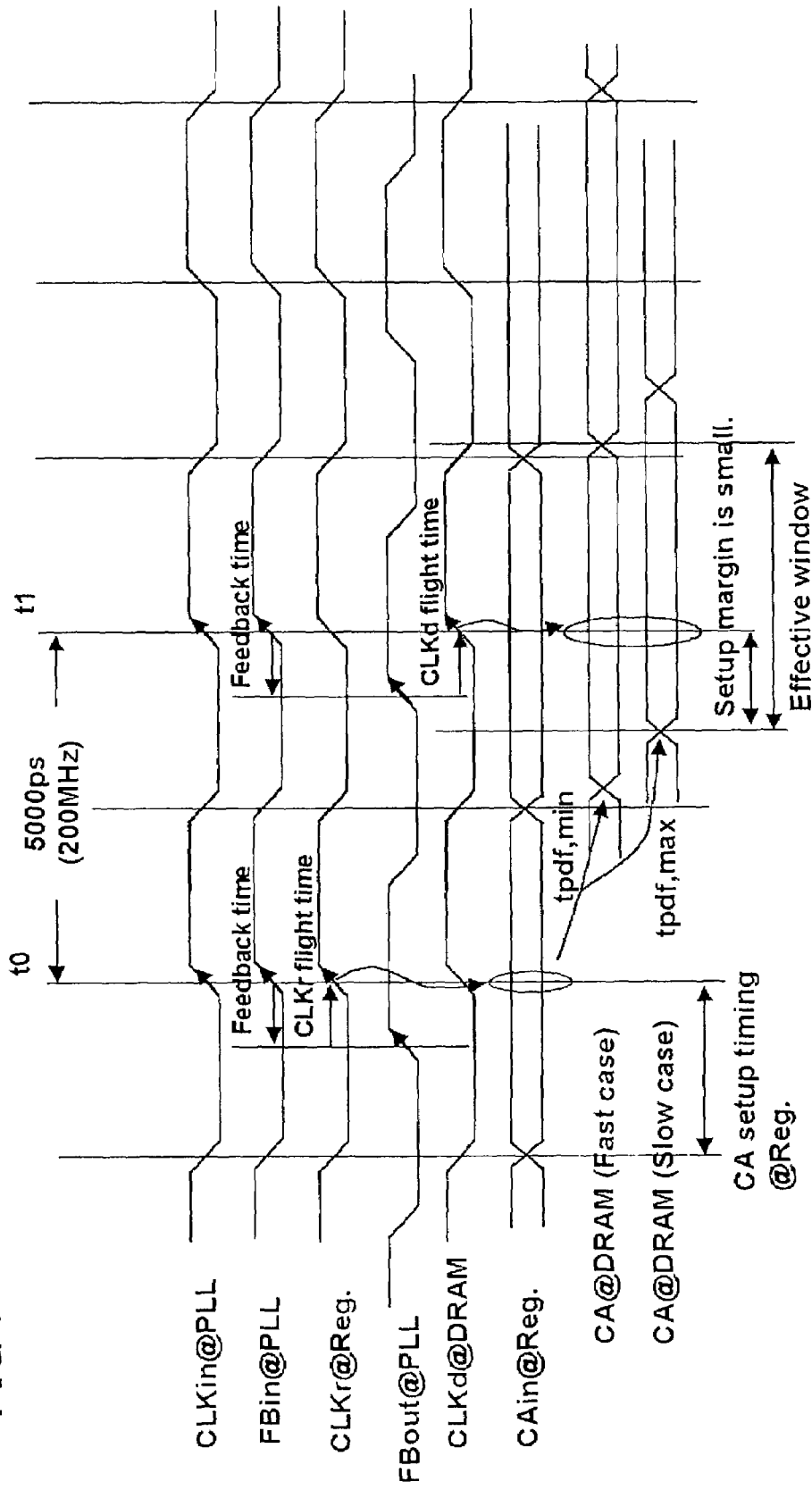

FIG. 15    PRIOR ART

Timing budget @DRAM

| Timing Parameters | Description | 266MHz CLK | 200MHz CLK |
|---|---|---|---|
|  | Timing budget | <3750 | <5000 |
| tJ,CLKp | CLK jitter for PLL | 75 | 75 |
| tSkew,CLKd | Channel Effect of CLK on module | 10 | 10 |
| tpdf,max | Register tpd + CA flight time, max | tpdf,max | tpdf,max |
| tTG | Register tester guardband | 150 | 150 |
| tFL | flight time estimation error (CLKr-CLKd) | 0 | 0 |
| Δt,PLL | PLL phase error, pin to pin skew, jitter | 0+50+50 | 0+50+50 |
| tS | tS of the DRAM | 510 | 510 |
| tSkew,All | Sum of all Skew | 845+tpdf,max | 845+tpdf,max |
| tM | Performance Reliability Setup Margin | 2905-tpdf,max | 4155-tpdf,max |

MEMORY SYSTEM, MODULE AND REGISTER

FIELD OF THE INVENTION

The present invention relates to a memory system and, more particularly, to a command/address system, having a register on a module loaded with a memory device, the module, and to the register.

BACKGROUND OF THE INVENTION

In a memory system employing a DDR (Double Data Rate)-I system of an SDRAM (synchronous DRAM) as a memory device, a command/address (CA) system, having a register on a memory module, is used. For example, in a technique employing stub-bus topology for a DQ bus and a clock bus, a clock signal (CLK), which is sent from the chip set or the memory controller, is distributed to plural memory devices arranged on a substrate of each memory module. The command/address signal (CA signal), which is sent from a chip set to a memory module over an external command/address (CA) bus, connected to the memory module, is latched by a command/address register, referred to simply as a register, provided on a memory module substrate. The so latched CA signal then is distributed to the memory devices over an internal CA bus reaching the memory device from the register.

FIG. 13 is a block diagram showing an illustrative structure of a CA bus system employed in the conventional DDR-I system. Referring to FIG. 13, the system includes a chip set 50, and at least one memory module 10, referred to simply as a module. On the module 10, there are provided a phase locked loop circuit (PLL) 30, a register, also termed a CA register 40, and a plural number of DRAMs (dynamic random access memories) 20-1 to 20-n, n being a preset positive integer not less than 2). These components are actuated responsive to a clock signal (CLK) and a command/address signal, also termed CA signal, output from the chip set 50.

The PLL 30 receives the clock signal (CLK) output from the chip set 50 to output a clock signal (CLKd) for the DRAM 20 and a clock signal (CLKr) for the register 40.

The register 40 receives the clock signal (CLKr), output from the PLL 30, and latches the CA signal from the chip set 50 to distribute the latched CA signal over an internal CA bus to the associated DRAMs 20-1 to 20-n.

The DRAMs 20-1 to 20-n latch the CA signal, output from the register 40, with the clock signal (CLKd) output from the PLL 30.

The clock timing is set so that
the flight time of the clock signal (CLKd) from the PLL 30 to the DRAMs 20-1 to 20-n,
the flight time of the clock signal (CLKr) from the PLL 30 to the DRAMs 20-1 to 20-n, and
the feedback time as from a feedback output of the PLL 30 (Fbout) until a feedback input (Fbin) is equal to one another so that the same phase will be obtained in the inputs to the PLL 30, to the register 40 and to the DRAMs 20-1 to 20-n. That is, the clock timing is set so as to be of an electrically equivalent length.

FIG. 14 is a timing chart for illustrating the operation of the conventional memory system shown in FIG. 13. Referring to FIG. 14, the clocks at respective input sections of the PLL 30, register 40 and the DRAM 20, that is
the clock input to the PLL 30 (CLKin@PLL of FIG. 14),
the feedback input to the PLL 30 (FBin@PLL of FIG. 14),
the clock input to the register 40 (CLKr@REG of FIG. 14) and
the clock input to the DRAM 20 (CLKr@DRAM of FIG. 14) are of the same phase, with the rise timing of the respective clock signals being at the center of the CA signal in the input unit to the register 40 (Cain@Reg. of FIG. 14) (see the position of the timing t0 in FIG. 14).

The CA signal, latched in the register 40, gets to the DRAM 20 over a time equal to the delay time tpdf, that is the delay time which elapses as from the time the clock signal (CLKr) is input to the register 40 (see Cain@Reg. at timing t0 in FIG. 14) until the register 40 outputs the CA signal, plus the flight time of the CA signal from the register 40 to the DRAM 20 (see CA@DRAM of FIG. 14). The DRAM 20 latches the oncoming CA signal with the rising edge of the clock signal (CLKd@DRAM of FIG. 14) (see timing t1 of FIG. 14) to take the signal in the DRAM 20.

FIG. 14 shows the timing operation of the clock frequency of 200 MHz (depicted as [200 MHzCLK]. In the generation of the clock frequency of 100 MHz, depicted as [100 MHzCLK], a stabilized operation was guaranteed with this timing.

That is, a sufficiently large margin could be taken of the setup time and the hold time of the CA signal with respect to the clock signal (CLKr) in the register 40, because the rising edge of the clock signal (CLKr) is located in the center timing of the CA signal in the input unit of the register 40.

Moreover, in the DRAM 20, the hold time of the CA signal with respect to the clock signal (CLKd) corresponding to the minimum value tpdf.min of the delay time tpdf could be necessarily guaranteed, as shown as CA@DRAM (Slow case) in FIG. 14. In the 100 MHz class generation, no margin-related problem was raised because the value of tpdf.min is of the order of 3 ns (nanosecond).

In the 100 MHz class (1 clock cycle=10 ns), the value of tpdf.max is of the same order of duration, or approximately 5 ns, for the 0.5 period, so that no problem was raised in connection with the setup time of the CA signal for the clock signal (CLKd).

Thus, by using the same phase for the clock signal at each input section (clock input end) of the PLL 30, register 40 and the DRAM 20, a sufficient margin can be taken for the setup time and the hold time of the CS signal at the register 40 and at the DRAM 20.

For phase matching the clock signal in the clock input section of the PLL 30, register 40 and the DRAM 20, it is basically sufficient to equate
the interconnection length of the clock signal (CLKd) from the PLL 30 to the DRAM 20,
the interconnection length of the clock signal (CLKr) from the PLL 30 to the register 40, and
the interconnection length of a feedback loop from a feedback output (Fbout) to the feedback input (Fbin) of the PLL 30 and hence there were raised no designing difficulties.

SUMMARY OF THE DISCLOSURE

However, the conventional DDR-I memory system, explained by referring to FIGS. 13 and 14, has suffered from the following deficiencies.

That is, when the operating frequency of the clock signal is raised, the delay time tpdf with respect to the clock period is of a non-negligible magnitude. The delay tpdf is the delay time which elapses as from the time the clock signal (CLKr) is input to the register 40 until the register 40 issues the CA signal, plus the flight time of the CA signal from the register 40 to the DRAM 20 (see FIG. 14). The result is that there is no margin for the setup time of the CA signal for the clock signal (CLKd) in the DRAM 20, such that no regular operation can be achieved.

For illustrating this problem in detail, FIG. 15 shows an example of a timing budget (Timingbudget) for 266 MHz-CLK and 200 MHzCLK in the conventional DDR-I memory shown in FIG. 13.

Referring to FIG. 15, the timing budget for 266 MHzCLK is smaller than one clock cycle (tCK)=3750 ps (picosecond), while the timing budget for 200 MHzCLK is smaller than one clock cycle (tCK)=5000 ps.

In FIG. 15, tJ.CLKp is the jitter of the clock signal(CLK) input to the PLL 30 of FIG. 13.

tSkew.CLKd is the skew of the flight time of the clock signal (CLKd) on the module 10 of FIG. 13.

tpdf.max is the maximum value of the time corresponding to the sum of the delay time tpd since the inputting of the clock signal (CLKr) to the register 40 of FIG. 13 and the flight time of the CA signal from the register 40 to the DRAM 20.

tTG is a guard band of a tester, not shown.

TFL is the difference between the clock signal (CLKr) for the register 40 of FIG. 13 and the flight time of the clock signal (CLKd) for the DRAM 20.

$\Delta$ t,PLL is the values of the specifications of the phase error of the PLL 30 of FIG. 13, pin-to-pin skew and jitter.

tS is the value of the specifications of the setup time of the DRAM 20 of FIG. 13.

The residual time resulting from subtraction from the clock period tCK of the maximum value of tpdf (tpdf.max), tS, $\Delta$ t,PLL, tSkew, cLKd, tJ,CLKp, tFL and tTG is the margin tM of the setup time of the CA signal for the clock signal (CLKd) in the DRAM 20 (see the following equation (1)):

$$tM=tCK-(tpdf.\text{max}+tS+\Delta\ t,PLL,\ tSkew,\ cLKd+tJ, CLKp+tFL+tTG) \quad (1).$$

By substituting the magnitudes of the respective items we have scrutinized, and by calculating the margin tM of the setup time, we obtain:

$$tM=4155-tdpf.\text{max} \quad (2).$$

where the unit is ps, for the case of the clock frequency of 200 MHz (see 200 MHzCLK of FIG. 15). For the clock frequency of 266 MFz (266 MHzCLK), we obtain:

$$tM=2905-tpdf.\text{max} \quad (3).$$

where the unit is ps (pico second).

That is, if, with the 200 MHzCLK, tpdf.max can be 4155 ps (approximately 4.1 ns) or less, it is possible to achieve a plus margin of the setup time for the CA signal for the clock signal (CLKd) in the DRAM 20.

Conversely, with the 266 MHzCLK, the plus margin of the setup time cannot be obtained unless tpdf.max is not larger than 2905 ps (approximately 2.9 ns).

The results of analysis of the value of tpdf.max by a transmission circuit simulation for the memory system of FIG. 13 indicated that, if the effect of cross-talk between signals is taken into consideration, it is well-nigh impossible to reduce the value of tpdf.max to 2905 or less.

That is, the present inventors have found that, for example, the 266 MHzCLK operation is impossible with the conventional DDR-I memory system.

In view of the above-depicted problem inherent in the above-described conventional system, it is a principal object of the present invention to provide a memory system, a memory module and a register that may be in operation not only for the operating frequency of e.g., 200 MHz but also for the operating frequency of 266 MHz with which the operation is retained to be infeasible with the conventional system.

The above and other objects are attained by the memory system in accordance with one aspect of the present invention, which includes a memory system comprising a chip set and a module including a phase locked loop circuit, a register and a memory device, in which the chip set sends a first clock signal (CLK) and a command/address signal (termed CA signal) for the memory device to the module, the phase locked loop circuit is fed from the chip set with the first clock signal to output a second clock signal (CLKd) supplied to the memory device at least, the register receives a third clock signal (CLKr) output from the phase locked loop circuit or the chip set to latch the CA signal output from the chip set to output the latched CA signal as a CA signal to be supplied to the memory device, and in which the memory device receives the second clock signal (CLKd) to latch the CA signal output from the register based on the second clock signal (CLKd). According to the present invention, the timings of the clock signal, input to respective clock input sections of the phase locked loop circuit, the memory device and the register are matched to one another, the register includes a flip-flop for determining the output timing of the CA signal based on a internal clock signal (intCLK) generated from the third clock signal (CLKr) input to the register, and timing controlling means for temporally advancing the timing of the internal clock signal (intCLK) supplied to the flip-flop with respect to the timing of the third clock signal (CLKr) at the input section of the register by the sum of delay time since the internal clock signal (intCLK) are input to the flip-flop until the register outputs the CA signal and the delay time since the register outputs the CA signal until the CA signal reaches the memory device, the timing controlling means controlling an output timing of the CA signal from the register so that the setup time margin and the hold time margin of the CA signal with respect to the second clock signal in the memory device will be equal to each other.

According to the present invention, the register includes, as the timing controlling means, a delay locked loop circuit (DLL), and a first replica in a register. A second replica is provided outside the register, with the first replica and the second replica forming a feedback loop of the delay locked loop circuit (DLL). The third clock signal (CLKr) input to the register are supplied to a first input terminal of the delay locked loop circuit, a signal from the feedback loop is input to a second input terminal of the delay locked loop circuit, delay control is made in the delay locked loop circuit so that the signals input to the first and second input terminals in the delay locked loop circuit will be in phase with each other. An output of the delay locked loop circuit is supplied as the internal clock signal (intCLK) to the flip-flop.

A module in accordance with another aspect of the present invention, includes a phase locked loop circuit, a register and a memory device, in which the module receives a first clock signal (CLK) and a command/address signal (termed CA signal) supplied from a chip set outside the module. The phase locked loop circuit receives the first clocks to output a second clock signal (CLKd) to be supplied at least to the memory device. The register receives a third clock signal (CLKr) output from the phase locked loop circuit or the chip set, and latches the CA signal supplied from the chip set based on the third clock signal (CLKr) to output the latched CA signal as a CA signal to be supplied to the memory device. The memory device receives the second clock signal (CLKd) to latch the CA signal output from the register based on the second clock signal (CLKd). According to the present invention, the clock signal, input to the clock input sections of the phase locked loop circuit, the memory device and the register, are matched in timing to one another. The register includes a flip-flop for determining the output timing of the CA signal based on an internal clock signal (intCLK) generated from the third clock signal (CLKr) input to the register, and timing controlling means for temporally advancing the timing of the internal clock signal (intCLK) supplied to the flip-flop with respect to the timing of the third clock signal (CLKr) at the input unit to the register by the sum of delay time since the internal clock signal (intCLK) are input to the flip-flop until the register outputs the CA signal and the delay time since the register outputs the CA signal until the CA signal reaches the memory device, the timing controlling means controlling an output timing of the CA signal from the register so that the setup time margin and the hold time margin of the CA signal with respect to the second clock signal in the memory device will be equal to each other.

A register in accordance with a further aspect of the present invention, includes a register loaded on a module along with a phase locked loop circuit and a memory device, in which the module receives a first clock signal (CLK) and a command/address signal (termed CA signal) from a chip set outside the module, the phase locked loop circuit receives the first clock signal to output a second clock signal (CLKd) supplied at least to the memory device. The memory device receives the second clock signal (CLKd) to latch the CA signal output from the register based on the second clock signal (CLKd). The register receives a third clock signal (CLKr) output from the phase locked loop circuit or the chip set to latch the CA signal supplied from the chip set based on the third clock signal (CLKr) to output the latched CA signal to be supplied to the memory device. According to the present invention, the third clock signal, input to the clock input unit of the register, are matched in timing to clock signal input to clock input sections of the phase locked loop circuit and the memory device. The register includes a flip-flop for determining the output timing of the CA signal based on an internal clock signal (intCLK) generated from the third clock signal (CLKr) input to the register, and timing controlling means for temporally advancing the timing of the internal clock signal (intCLK) supplied to the flip-flop with respect to the timing of the third clock signal (CLKr) by the sum of delay time since the internal clock signal (intCLK) are input to the flip-flop until the register outputs the CA signal and the delay time since the register outputs the CA signal until the CA signal reaches the memory device. The timing controlling means controls an output timing of the CA signal from the register so that the setup time margin and the hold time margin of the CA signal with respect to the second clock signal in the memory device will be equal to each other.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRWINGS

FIG. 4 is a timing budget in a DRAM of a first embodiment of the present invention.

FIG. 5 shows a timing budget in a flip-flop 1 of the register in the first embodiment of the preset invention.

FIG. 6 shows a timing budget in a flip-flop 2 of the register in the first embodiment of the preset invention.

FIG. 9 depicts a timing budget in a flip-flop 1 of the register in the second embodiment of the preset invention.

FIG. 10 depicts a timing budget in a flip-flop 1 of the register in the second embodiment of the preset invention.

FIG. 14 depicts a timing chart of the conventional memory system.

FIG. 15 depicts a timing chart in a DRAM of the conventional memory system.

PREFERRED EMBODIMENTS OF THE INVENTION

Figure 1:
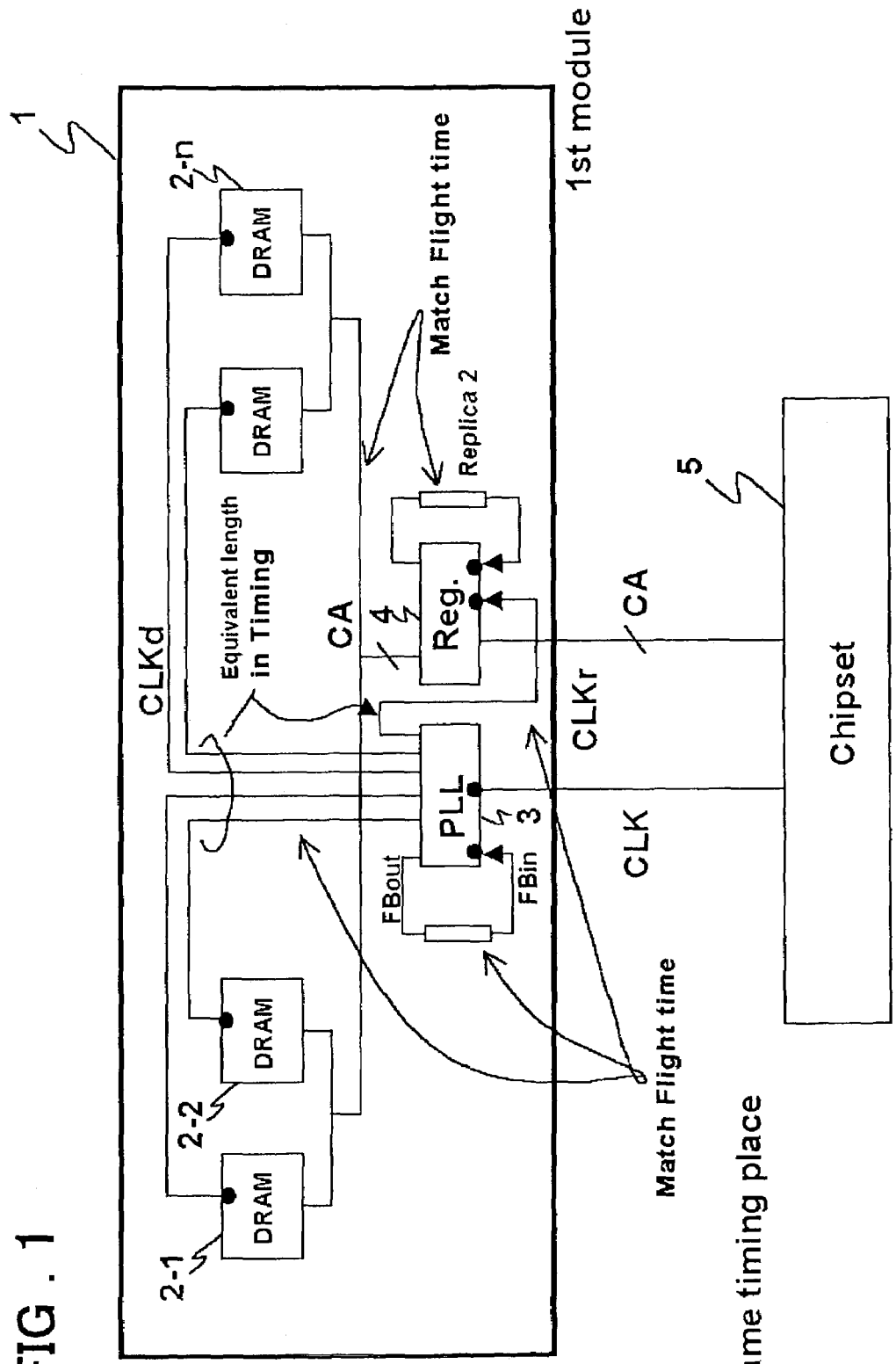
FIG. 1 shows the system configuration of the first embodiment of the present invention.

Now, certain embodiments of the present invention are explained. In the following, certain preferred embodiments of the present invention and the operating principles thereof are explained and then certain embodiments of the present invention are explained. The present invention provides a memory command/address (CA) system, referred to simply as a memory system, comprising a chip set (5 of FIG. 1) and a module including a phase locked loop circuit (PLL) (3 of FIG. 1), a register (4 of FIG. 1) and a memory module, referred to simply as a module, having plural memory devices (DRAMs 22-1 to 2-n of FIG. 1), in which the chip set (5) sends a clock signal (CLK) and a command/address signal (termed CA signal) for the memory device (2) to the module (1). The PLL (3) is fed from the chip set (5) with the clock signal (CLK) to output a clock signal (CLKd) supplied at least to the memory device (2). The register (4) receives the clock signal (CLKr) output from the PLL (3) to latch the CA signal output from the chip set (5) to output the latched CA signal as a CA signal to be supplied to the memory device (2). The memory device (2) receives the clock signal (CLKd) to latch the CA signal output from the register (4) based on the clock signal (CLKd). The clock timings in the input sections of the PLL (3), register (4) and the memory device (2) on the module (1) are matched to one another. The register (4) includes a delay synchronization loop (delay locked loop) circuit, termed [DLL], to control output timing of the CA signal output from the register (4) to the memory device (2) so that the setup time margin and the hold time margin of the CA signal with respect to the clock signal (CLKd) with an additional latency of 1.5 or 2.0 in the memory device (2) are equal to each other (see FIGS. 3 and 8). Thus, the operation with the clock frequency of 266 MHz is possible.

Figure 3:
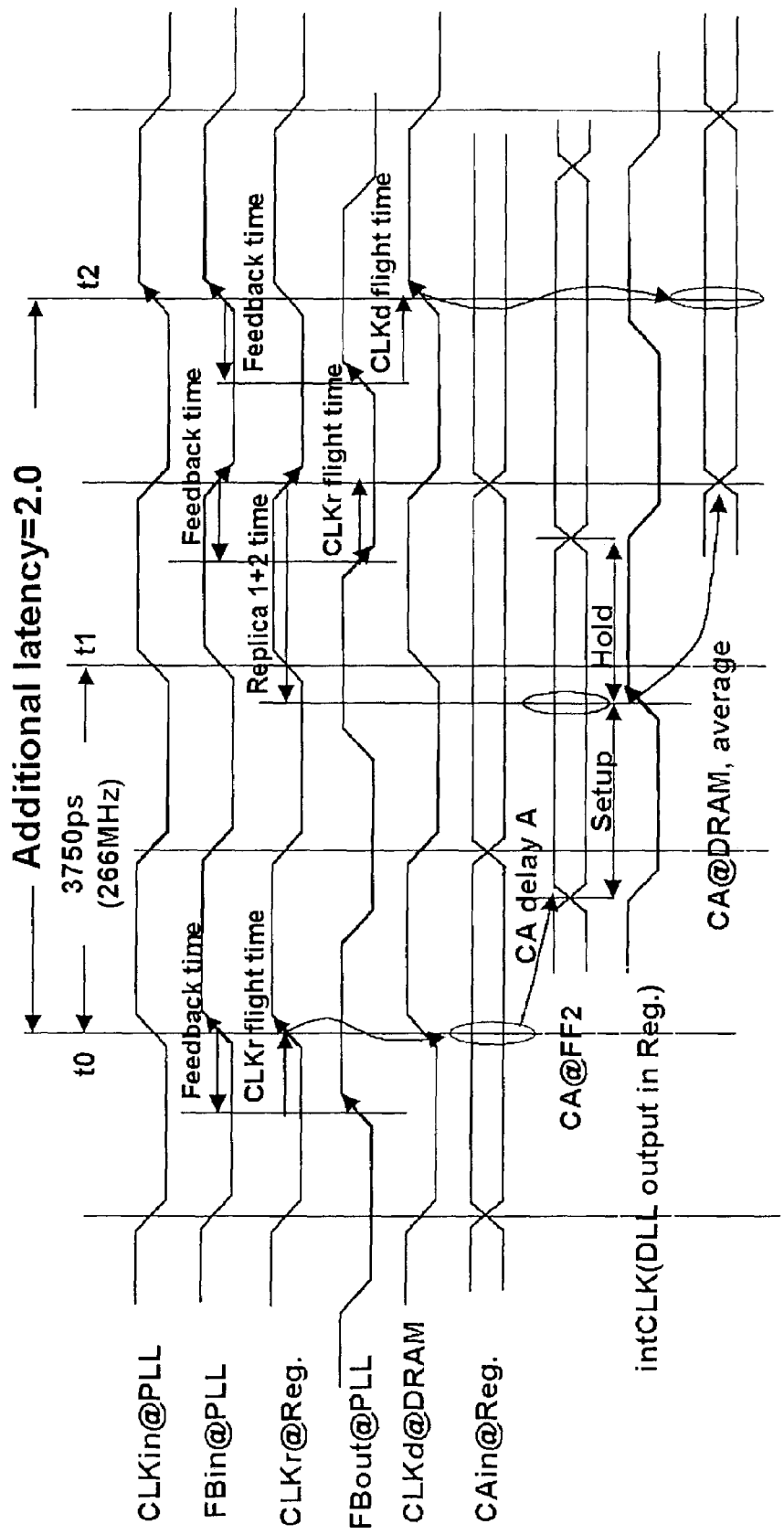
FIG. 3 is a timing chart for 266 MHzCLK in the first embodiment of the present invention.

The "additional latency=2.0" means that the time as from the timing of transition of the clock signal (CLKr@Reg. of FIG. 3) taking in the CA signal from the register (4) until the timing of transition of the clock signal (CLKr@DRAM of FIG. 3) taking in the CA signal from the register (4) to the DRAM (2) corresponds to 2 clock cycles (=2×tCK) (see the time with timing t0 to t2 of FIG. 3).

Figure 13:
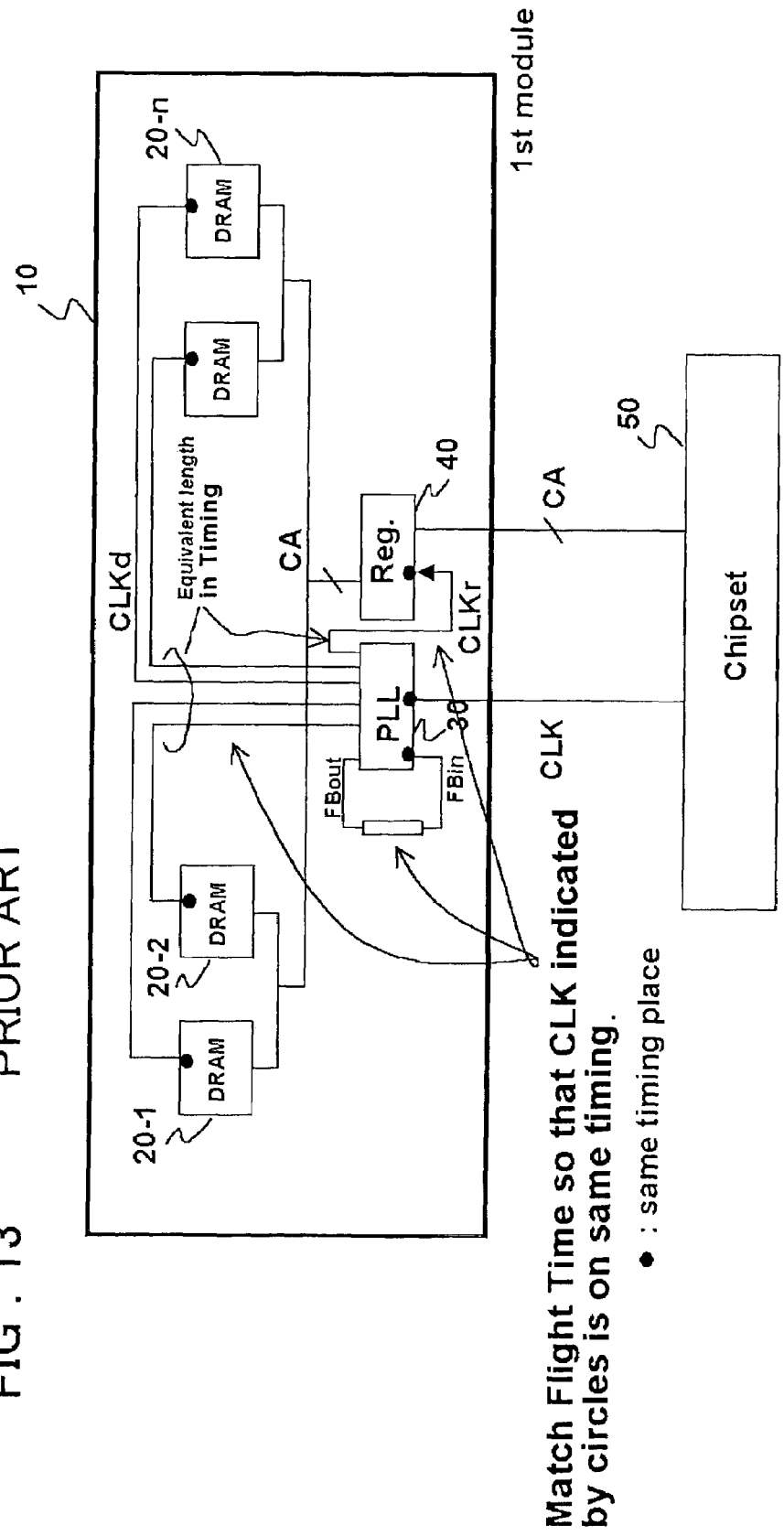
FIG. 13 depicts a block diagram showing a conventional memory system.

The additional latency of the conventional system shown in FIG. 13 is targeted at 1.0. In this case, however, the timing margin of the setup time (setup margin) cannot be taken in the DRAM 20. That is, in the conventional system, shown in FIG. 13, the additional latency=1.0 corresponds to one clock cycle of timings t0 to t1 of FIG. 14, such that, as already explained as the problem inherent in the conventional system, no sufficient setup time for the clock signal (CLKd) of the CA signal in the DRAM from the value of tpdf.max can be taken during the operation with the clock frequency of 266 MHz.

Nevertheless, if the additional latency is set to 1.5, the timing margin of the hold time of the CA signal with respect to the clock signal (CLKd) in the DRAM cannot be taken, as may be seen from FIG. 14. That is, if, in the conventional system, the additional latency is 1.5, the time since the rise transition timing (t0) of CLKd@DRAM until the rise transition of CLKd@DRAM of FIG. 14 is 1.5×1 clock cycle (tCK), such that the hold time for holding the value of the CA signal in order that the CA signal may be taken in the DRAM as from the rise timing of the clock (CLKd) cannot be maintained.

If both the clock operating frequencies of, for example, 266 MHz and 200 MHz, are applied, a timing budget (Timingbudget) table is considered and control is made for delaying the timing of the CA signal input to the flip-flop supplied with the internal clock signal (intCLK) output from the DLL determining the output timing of the CA signal from the register (4), or for switching between a replica (replica1) provided in the register (4) and an output unit associated with the replica, depending on the frequency being used, so that these both frequencies can be coped with by simply providing each one sort of the module and the register.

According to the present invention, a register (4), generating internal clock signal (intCLK) from the input clock signal, taking in the CA signal depending on the internal clock signal, generating the CA signal for the memory device and outputting the so generated CA signal, includes a first input buffer (4-1 of FIG. 2) supplied via an input terminal with the CA signal supplied from the chip set, a second input buffer (4-7 of FIG. 2) supplied via an input terminal with the aforesaid clock signal, a first flip-flop (4-3 of FIG. 2) having a data input terminal connected to an output terminal of the first input buffer and having a clock signal terminal connected to an output terminal of the second input buffer for sampling the signal supplied to the data input terminal, based on the transition of the clock signal supplied to the clock signal terminal, to output the sampled signal at a data output terminal, a delay locked loop circuit (4-5 of FIG. 2) supplied with clock signal output from the second input buffer to a first input terminal, a second flip-flop (4-4 of FIG. 2) having a clock signal terminal connected to an output terminal of the delay locked loop circuit and having a clock signal terminal connected to an output terminal of the delay locked loop circuit, for sampling the signal supplied to the data input terminal based on the transition of the internal clock signal supplied from an output terminal of the delay locked loop circuit to the clock signal terminal to output the sampled signal at a data output terminal, a first output buffer (4-2 of FIG. 2) having an input terminal connected to a data output terminal of the second flip-flop to output CA signal from an output terminal to a memory device outside the register, and a first replica (4-6 of FIG. 2) having an input terminal connected to an output terminal of the delay locked loop circuit to delay a signal input to the input terminal by a sum of the delay time of the second flip-flop and the delay time of the output buffer to output the resulting signal. The signal output from the first replica is input to a second replica (4-9 of FIG. 2) provided outside the register, so as to be delayed by a time corresponding to the flight time until the CA signal is output from the output terminal of the output buffer to reach the memory device. The register further includes a third input buffer (4-8 of FIG. 2) an input terminal of which is supplied with clock signal output from the second replica. The third input buffer has an output terminal connected to a second input terminal of the delay locked loop circuit (4-5), and delay control is made in the delay locked loop circuit so that the signals input to the first and second input terminals thereof will be in phase with each other.

In an embodiment of the present invention, a register includes a first input buffer (4-1 of FIG. 7) which receives via an input terminal, the CA signal supplied from the chip set, a second input buffer (4-8 of FIG. 7) which receives via an input terminal, a clock signal supplied from the chip set, a delay locked loop circuit (4-5 of FIG. 7) which receives a clock signal output from the second input buffer at a first input terminal, a flip-flop (4-4 of FIG. 7) which has a clock signal terminal connected to an output terminal of the delay locked loop circuit and has a data input terminal connected to an output terminal of the first input buffer, for sampling the signal supplied to the data input terminal based on the transition of the internal clock signal supplied from the output terminal of the delay locked loop circuit to the clock signal terminal to output the sampled signal at a data output terminal, a first output buffer (4-2 of FIG. 7) which has an input terminal connected to a data output terminal of the flip-flop and which is adapted for outputting the CA signal from an output terminal to a memory device outside the register, and a first replica (4-6 of FIG. 7) which has an input terminal connected to an output terminal of the delay locked loop circuit for delaying the clock signal input to the input terminal a time corresponding to the sum of the delay time of the flip-flop and the delay time of the output buffer to output the resulting signal at an output terminal. The signal output from the first replica is input to a second replica provided outside the register and is delayed in the second replica a time corresponding to the flight time during which the CA signal is output from the output terminal of the output buffer to reach the memory device. The register also includes a third input buffer (4-8 of FIG. 7) supplied at an input terminal with clock signal output from the second replica. An output terminal of the third input buffer is connected to a second input terminal of the delay locked loop circuit (4-5). The delay locked loop circuit controls the signal delay so that the signals input to the first and second input terminals of the delay locked loop circuit are in phase with each other.

In an embodiment of the present invention, the register may be provided with a circuit (4-10 of FIG. 12) supplied with clock signal output from the delay locked loop circuit to generate a clock signal for the memory device, and a second output buffer (4-11 of FIG. 12) for outputting the generated clock signal from an output terminal.

In an embodiment of the present invention, the register may be provided with a delay circuit between the data output terminal of the first flip-flop (4-3 of FIG. 2) and the data input terminal of the second flip-flop (4-4 of FIG. 2), with the delay time of the delay circuit being selectable to respective different values. The delay circuit selects one delay time associated with one of plural clock operating frequencies which is in use.

In an embodiment of the present invention, the register may be provided with a delay circuit between the data output terminal of the second flip-flop (4-4 of FIG. 2) and the input terminal of the output buffer (4-2 of FIG. 2), with the delay time of the delay circuit being selectable to respective different values. The delay circuit selects one delay time associated with one of plural clock operating frequencies which is in use.

In an embodiment of the present invention, the delay time of the first output buffer (4-2 of FIGS. 2 and 7) outputting the CA signal is variably controlled. The first output buffer selects one delay time associated with one of plural clock operating frequencies which is in use.

In an embodiment of the present invention, the delay time of the first replica can be switched between plural values. The delay time of the first replica can be switched depending on the delay time of the first output buffer.

In an embodiment of the present invention, the delay time of the first replica (4-6 of FIGS. 2 and 7) and/or the second replica (4-9 of FIGS. 2 and 4) is variably controlled. The first replica and/or the second replica selects one delay time associated with one of plural clock operating frequencies which is in use.

[Embodiments]

Referring to the drawings, certain preferred embodiments of the present invention will be explained in detail. Similarly to the system of FIG. 13, the present memory system of FIG. 1 is comprised of a CA system of DDR-I, and includes a chip set 5, one or more memory module 1, referred to simply as module, at least one PLL (phase locked loop circuit) 3, provided to the module 1, at least one command/address (CA) register 4, referred to simply as [register], and a plural number of DRAMs 2-1 to 2-$n$, n being an integer not less than 2. This memory system 1 operates responsive to a clock signal (CLK) output from the chip set 5. In FIG. 1, only a sole module arrangement is shown for simplicity sake.

The operation of the memory system of the first embodiment of the present invention is now explained. The PLL 3 receives the clock signal (CLK) from the chip set 5 to output a clock signal (CLKd) to be supplied to the DRAMs 2-1 to 2-$n$ and a clock signal (CLKr) to be supplied to the register 4.

Using the clock signal (CLKr), output from the PLL 3, the register 4 receives and latches the command/address signal, termed [CA signal], output from the chip set 5 to the CA bus, again latches the latched CA signals with timing-controlled internal CLK (intCLK) to output the resulting CA signal over an internal CA bus to the DRAMs 2-1 to 2-$n$. Alternatively, the register 4 latches the CA signal, output from the chip set 5, using the timing-controlled internal CLK (intCLK), based on the clock signal (CLKr), output from the PLL 3, to output the latched CA signal to the DRAMs 2-1 to 2-$n$.

The DRAMs 2-1 to 2-$n$ latch the CA signal, output from the register 4, using the clock signal (CLKd) output from the PLL 3, to take in the latched CA signal in the DRAMs 2-1 to 20$n$.

A second delay replica, mounted externally to the register 4 (termed simply [second replica2]), is provided for controlling the timing of the internal clock signal (intCLK) of the register 4. The flight time of the replica (Replica2) is designed to be equal to the flight time of the CA signal from the output of the register 4 to the inputs of the DRAMs 2-1 to 2-$n$.

The clock timing at each point is set so that
the flight time of the clock signal (CLKd) from the PLL 3 to the DRAMs 2-1 to 2-$n$,
the flight time of the clock signal (CLKr) from the PLL 3 to the DRAMs 2-1 to 2-$n$, and
the feedback time as from the feedback output of the PLL 3 (Fbout) to feedback input (Fbin) will be equal to one another so that the same phase will be obtained in the inputs to the PLL 3, register 40 and the DRAMs 2-1 to 2-$n$. That is, the clock timing is set so as to be of an electrically equivalent length.

In the system shown in FIG. 1, the clock signal (CLKr), input to the register 4, are supplied from the PLL 3. Alternatively, the clocks to the register 4 may be directly supplied from the chip set 5, because the clocks to the input unit of the PLL 3 is set to the same timing as those to the input unit of the register 4.

Moreover, the flight time of the clock signal (CLK) from the chip set 5 to the PLL 3 is summed to the flight time of the CA signal from the chip set 5 to the register 4. The memory system of the embodiment shown in FIG. 1 is further explained in detail.

Figure 2:
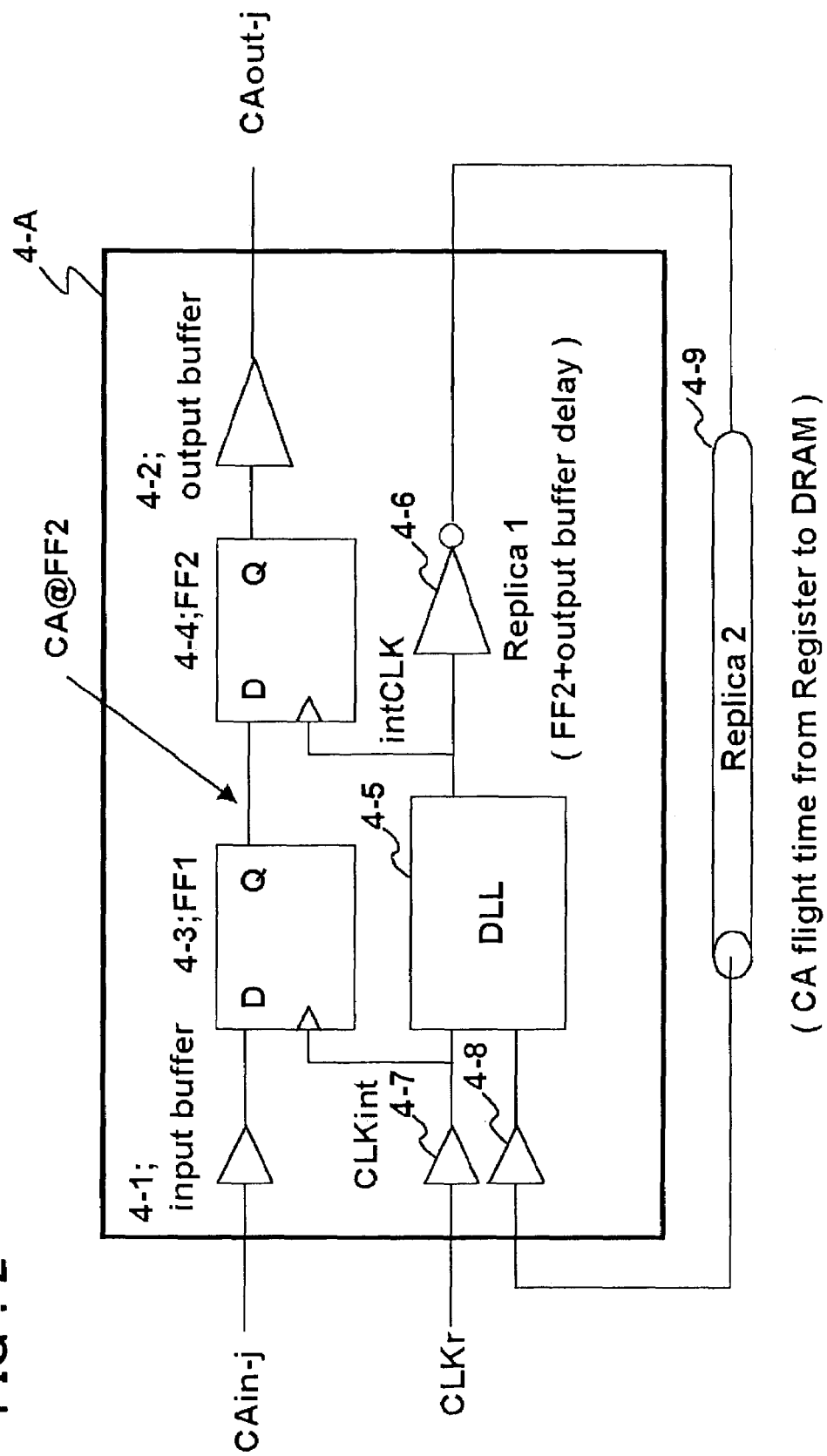
FIG. 2 shows the structure of a register of the first embodiment of the present invention.

FIG. 2 shows an illustrative structure of the register 4 of FIG. 1 (register 4-A). In FIG. 2, the register 4-A includes an input buffer 4-1, an output buffer 4-2, a first flip-flop 4-3 (FF1) for sampling the CA signal into the register 4 with the clock signal (CLKr), a second flip-flop 4-4 (FF2) for latching the sampled CA signal with the timing-controlled internal clock signal (intCLK) to output the resulting signal, a DLL (delay locked loop circuit) 4-5 for generating the internal clock signal (intCLK), a first delay replica 4-6 (replica1), simply referred to as a first replica, for temporally advancing the transition timing of the internal clock signal (intCLK) to ahead of the clock signal (CLKr), and a second delay replica 4-9 (replica2), simply referred to as a second replica, mounted externally of the register 4-A.

An output terminal of a buffer 4-4, supplied with the clock signal (CLKr), is connected to the clock input terminal of the first flip-flop 4-3 (indicated by ">" in FIG. 2), whilst an output terminal of the input buffer 4-1 is connected to the data input terminal D of the first flip-flop 4-3. The timing-controlled internal clock signal (intCLK), output from the DLL 4-5, are sent to the clock input terminal (indicated by ">"), while a data input terminal D of the second flip-flop 4-4 is connected to the data output terminal Q of the first flip-flop 4-3. The second, replica (replica2) 4-9 is an external replica and receives an output of the first replica 4-6. The output is input to the input buffer 4-9 so as to be supplied to the DLL 4-5, in a timed relation to the flight time until the CA signal exiting the register 4 gets to the DRAM 2.

In FIG. 2, one of Cain-j and CAout-j is shown as the CA signal input to the register 4-A and output from the register 4-A, for simplicity sake. A plural number of the CA signal may, however, be used, in which case a plural number of routes for the input buffer 4-1, flip-flops 4-3 and 4-4 and the output buffer 4-2 are provided in juxtaposition.

The DLL 4-5 is of a known circuit structure in which there is provided a variable delay circuit, not shown, supplied with the input signal from a first input terminal (output of the input buffer 4-7 in FIG. 3), and a phase comparator, not shown, which compares the phase of a second input signal (an output of the input buffer 4-8 in FIG. 3) entered from a second input terminal which composes a feedback input terminal to the phase of the first input signal from the first input terminal, and in which the delay time of the variable delay circuit is variably controlled based on the result of phase comparison (lag or lead). The clock signal(CLKr) may be transmitted in a differential mode, in which case the input buffer 4-7 is made up by a receiver having a differential input stage for differentially inputting the complementary clock (CLKr) signals. The input buffers 4-1 and 4-8 may also be comprised of a receiver including a differential input stage which differentially receives the reference voltage and an input signal.

The first replica (Replica1) 4-6 is in keeping with the delay time since the internal clock signal (intCLK) is fed to a clock input terminal of the second flip-flop 4-4 until the CA signal appears in an output pin of the register 4 (output pin connected to an output terminal of the output buffer 4-2).

FIG. 3 depicts a timing chart showing an illustrative operation in a 266 MHzCLK (with the frequency of clocks CLK of 266 MHz) in case the register 4-A of FIG. 2 is used as the register 4 of the system of FIG. 1.

Referring to FIG. 3, the clocks to the inputs to the PLL 3, DRAM 2 and the register 4, that is the clock input to the PLL 3 (CLKin@PLL),
the feedback input to the PLL 3 (FBin@PLL),
the clock input to the register 4 (CLKr@REG) and
the clock input to the DRAM 20 (CLKr@DRAM)

are of the same phase, with the rising edge of the respective clock signals being at the center of the CA signal in the input to the register 4 (Cain@Reg.) (see the position of the timing t0 in FIG. 3).

The first flip-flop 4-3 latches the CA signal at the rising time of the input clock signal (CLKr). That is, the first flip-flop 4-3 samples the CA signal, output from the input buffer 4-1 and sent to the data input terminal D, at a rising transition of the clock signal (CLKint) output from the input buffer 4-7 receiving the clock signal (CLKr), to output the sampled signal from the data output terminal Q.

The CA signal gets to the second flip-flop 4-4 after a delay time (CA delay A) as from the inputting of the clock signal (CLKr) to the register 4, that is, as from the rise timing of CLKr@Reg of FIG. 3. This delay (CA delay A) is that as from the taking of the CA signal (Cain@Reg.) by the clock signal (CLKr) until taking of the CA signal by the second flip-flop 4-4. The reference value of this delay signal (CA delay A), which signal undergoes a variations depending on the manufacture tolerances of the registers 4 or the use environmental conditions, is shown in FIG. 3.

The second flip-flop 4-4 latches the CA signal input to the data input terminal (see CA{fourth root}FF2) with the rising edge of the internal clock signal (intCLK), temporally advanced from the clock signal (CLKr) of the input unit of the register 4 by the sum of the delay time of the first replica (Replica1) 4-6 and that of the second replica (Replica2) 4-9, by the DLL 4-5.

The first replica (Replica1) 4-6 is a delay replica of the delay time of the flip-flop 4-4 and the output buffer 4-2, whilst the second replica (Replica2) 4-9 is a delay replica of the flight time of the CA signal from the outputting of the register 4 to the inputting of the DRAM 2.

Thus, in the second flip-flop 4-4, the CA signal latched by the rising edge of the internal clock signal (intCLK) in the second flip-flop 4-4 (CA@FF2 at the timing t1 of FIG. 3) gets to the DRAM 2 so that the rising edge of the clock signal for DRAM (CLKd) will be at the center timing of the CA signal at the input to the DRAM 2 (see CA@DRAM of FIG. 3).

In actuality, the CA signal arriving at the DRAM 2 is faster or slower than the state of FIG. 3 depending on e.g., output variations of the CA signal of the register 4. As a standard (average) value (CA@DRAM, average), the timing position is as shown in FIG. 3.

That is, in the DRAM 2, the clock signal (CLKd) rises at the mid timing of the CA signal, so that, in the DRAM 2, the margin of the setup time of the CA signal is equal to that of the hold time thereof relative to the clock signal (CLKd).

Meanwhile, there are two clock cycles as from the rise timing (t0 of FIG. 3) of the clock signal (CLKr) taking the CA signal into the register 4 until the rise timing (t2 of FIG. 3) of the clock signal (CLKd) taking the CA signal to the DRAM 2. Thus, the additional latency is 2.0. Of course, the additional latency can be increased to 2.5, 3.0 and so forth depending on the operating frequency, flight time of the CA signal or the delay time of the output unit of the register 4.

The timing budget (Timingbudget) of the present embodiment is now explained. FIG. 4 shows the timing budget of the setup time and the hold time of the CA signal (CA@DRAM) with respect to the clock signal (CLKd) in the DRAM of the present embodiment. The timing budget is a one-half period for 266 MHzCLK and 200 MHzCLK, that is, 1875 ps and 2500 ps.

In FIG. 4, tJ,CLKp stand for jitter of the clock signal (CLK) input to the PLL 3 of FIG. 1.

tSkew,CLKd stands for the skew of the flight time of the clock signal on the module 1.

tDuty,CLK stands for the duty cycle error of the clock signal (CLK) input to the PLL 3 of FIG. 1.

tQR is the variation of the access time of the register 4 of FIG. 1.

tSkew,PD is the flight time error of the second replica (Replica2) and CA of FIG. 1.

Δ tPD is the skew of the CA signal in the input to the DRAM 2 of FIG. 1.

Δ t,PLL is the value of the specifications of the phase error, pin-to-pin skew and jitter of the PLL 3 of FIG. 1.

tFL is the difference between the flight time of the clock signal CLKr and that of the clock signal CLKd.

tS/tH is the value of the specifications of the setup time and the hold time of the DRAM 2.

With the 266 MHzCLK, the remaining time corresponding to 1875 ps of one-half period (tCK/2) less tQR (variation of the CA access time of the register 4),
tS/tH (the specification values of the setup time and hold time of DRAM 2),
Δ t,PLL (pin-to-pin skew and jitter of the PLL 3),
tSkew,CLKd (flight time or skew of the clock signal (CLKd) on the module),
tJ,CLKp (jitter of the clock signal (CLK) input to PLL 3),
tDuty,CLK (duty cycle error of the clock signal (CLK)),
tFL (flight time difference of the clock signal (CLKr) and the clock signal (CLKd)),
Δ tPD (skew of the CA signal in an input to the DRAM 2), and
tSkew,PD (flight time error of the second replica (Replica2) and the CA signal)

becomes a margin tM in the DRAM 2 of the setup time and the hold time of the CA signal with respect to the clock signal (CLKd) (see the following equation (4)):

$$tM=t/CK/2-(tQR+tS/tH+\Delta\ t,PLL+tSkew,\ CLKd+tJ,\\ CLKp+tDuty,\ CLK+tFL+\Delta\ tPD+tSkew,\ PD) \quad (4).$$

The same holds basically for 200 MHzCLK. The margin is increased by an increasing amount (625 ps) corresponding to one half period.

The margin tM is calculated by substituting the values of the respective items into which we have scrutinized. Thus, for 266 MHz, the margin is 162 ps for each of the setup time and the hold time.

For 200 MHz, tM is 787 ps for each of the setup time and the hold time.

That is, even if the operating frequency is changed, the margin for the setup time and that for the hold time of the CA signal are equal at all times to each other for the so changed operating frequency, thus achieving a maximum value.

FIG. 5 shows the timing budget of the setup time and the hold time of the CA signal for the clock signal (CLKr) in a first flip-flop 4-3 (FF1) of the register 4-A for 266 MHzCLK and 200 MHzCLK.

With the 266 MHzCLK, the remaining time corresponding to 1875 ps of one-half period (tCK/2) less tQ,CS, which is the skew of CA output from the chip set 5, intrinsic setup time and hold time tS/tH, FF1 of the first flip-flop 4-3 (FF1) in the register 4-A, tJ,CLKp, which is the jitter of the clock signal (CLK) input to the PLL 3;

Δ t,PLL, which is the pin-to-pin skew and jitter of the PLL or the phase error of the PLL 3, tFBFL of the flight time error of the feedback time and the clock signal (CLKr), tCE,MB which is the skew of the CA signal getting to the register 4-A from the chip set 5, delay time difference Δ tRCV of the input buffer 4-1 for the CA signal and the input buffer 4-8 for the clock signal CLKr, and a distribution error tSkew, CLKint of the internal clock signal (CLKint) as an output of the input buffer 4-8 becomes a margin tM in the first flip-flop 4-3 in the register 4-A of the setup time and the hold time of the CA signal with respect to the clock signal (CLKr) (see the following equation (5)):

$$tM=t/CK/2-(tQ,CS,\ +tS/tH,\ FF1+tJ,CLKp+\Delta\ t,PLL+\\ tFBFL+tCE,MB+\Delta\ tRCV+tSkew,CLKint) \quad (5).$$

The same holds basically for 200 MHzCLK. The margin is increased by an increasing amount (625 ps) corresponding to one half period.

The margin tM is calculated by substituting the values of the respective items into which we have scrutinized. Thus, for 266 MHz, the margin is 900 ps for each of the setup time and the hold time. For 200 MHzCLK, tm=1525 ps.

FIG. 6 shows the timing budget (Timingbudget) of the setup time and the hold time of the CA signal with respect to the clocks (intCLK) in a second flip-flop 4-4 in the register 4-A of the present embodiment (output of the DLL 4-5) for 266 MHzCLK and 200 MHzCLK.

With the setup for 266 MHzCLK, the remaining time corresponding to 5625 ps of one and a half period less tJ,CLKp, which is the jitter of the clock signal input to the PLL3, a duty cycle error Duty,CLK of the clock signal (CLK), Δ t,PLL as a value of the specifications of one cycle and one half cycle jitter of the PLL 3, CA delayA max as the maximum value of the delay time of the input buffer 4-7 for clock signal (CLKr) and the maximum value of the delay time of the flip-flop 4-3 (FF1), tReplica1,2max as the maximum value of the delay time of the first replica (Replica1) and the second replica (Replica2), and setup time t setup of the second flip-flop 4-4, where the setup time t setup of the second flip-flop is the intrinsic setup time of the second flip-flop 4-4 (FF2)+delay time difference of the input buffer connected to the DLL4-5+jitter in the DLL4-5+distribution error of the internal clock signal (intCLK)

becomes the margin tM of the setup time of the CA signal with respect to the internal clock signal (intCLK) in the flip-flop 4-4 in the register 4-A.

$$tM=1.5CK-(tJ,CLKp+Duty,CLK+\Delta\ t,PL+Cade-\\ layAmax+tReplica1,2max+tst) \quad (6).$$

With the hold for the 266 MHzCLK, the remaining time corresponding to the sum of the delay time (tpdbuf) of the input buffer 4-7 for clock signal (CLKr), CAdelayAmin, as the minimum value of the delay time of the flip-flop 4-3 (FF1), and tReplica1,2min, as the minimum value of the delay time of the first replica (Replica1) 4-6 and the second replica (Replica2) 4-9, less tJ,CLKp as the jitter of the clock signal (CLK) input to the PLL3, tDuty,CLK as a duty cycle error of the clock signal (CLK)

Δ t,PLL, as a value of the specifications of one cycle and one half cycle jitter of the PLL 3, and the hold time thold of the flip-flop 4-4, where the hold time t is the intrinsic hold time of the second flip-flop 4-4 (FF2)+delay time difference of the input buffer 4-7 connected to the DLL 4-5+jitter in the DLL 4-5+distribution error of the internal clock signal (intCLK)

becomes the margin tM of the hold time of the CA signal with respect to the internal clock signal (intCLK) in the flip-flop 4-4 in the register 4-A (see the following equation (7):

$$tM=(tpdbuf+CadelayAmi+tReplica1,2min)-(tJ,\\ CLKp+tDuty,CLK+\Delta\ tPLL+thold)-tCK/2 \quad (7).$$

By substituting the margin tM of the respective items we have scrutinized, and by calculating the margin tM, the setup time margin is 265 ps and the hold time margin is 725 ps for the frequency of 266 MHz, while the setup time margin is 2140 ps and the hold time margin is 100 Ps for the frequency of 200 MHzCLK.

It is noted that the maximum value and the minimum value of the first replica (Replica1) 4-6+second replica (Replica2) 4-9 are 3500 ps and 2300 ps, respectively.

In order to make the sign of the margins positive in their entirety, an inverter sequence of, for example, an even number of stages, forming a delay circuit, not shown, are arranged between the data output terminal Q of the first flip-flop 4-3 of FIG. 2 and the data input terminal D of the second flip-flop 4-4 of FIG. 2, is arranged, and a delay time α is added.

The maximum value and the minimum value of the delay time of the inverter sequence are set to 600 ps and to 400 ps, respectively. By controlling the delay time of the CA signal in the register 4-A, such a register 4-A which is able to cope with both 266 MHz and 200 MHz may be realized.

Figure 11:
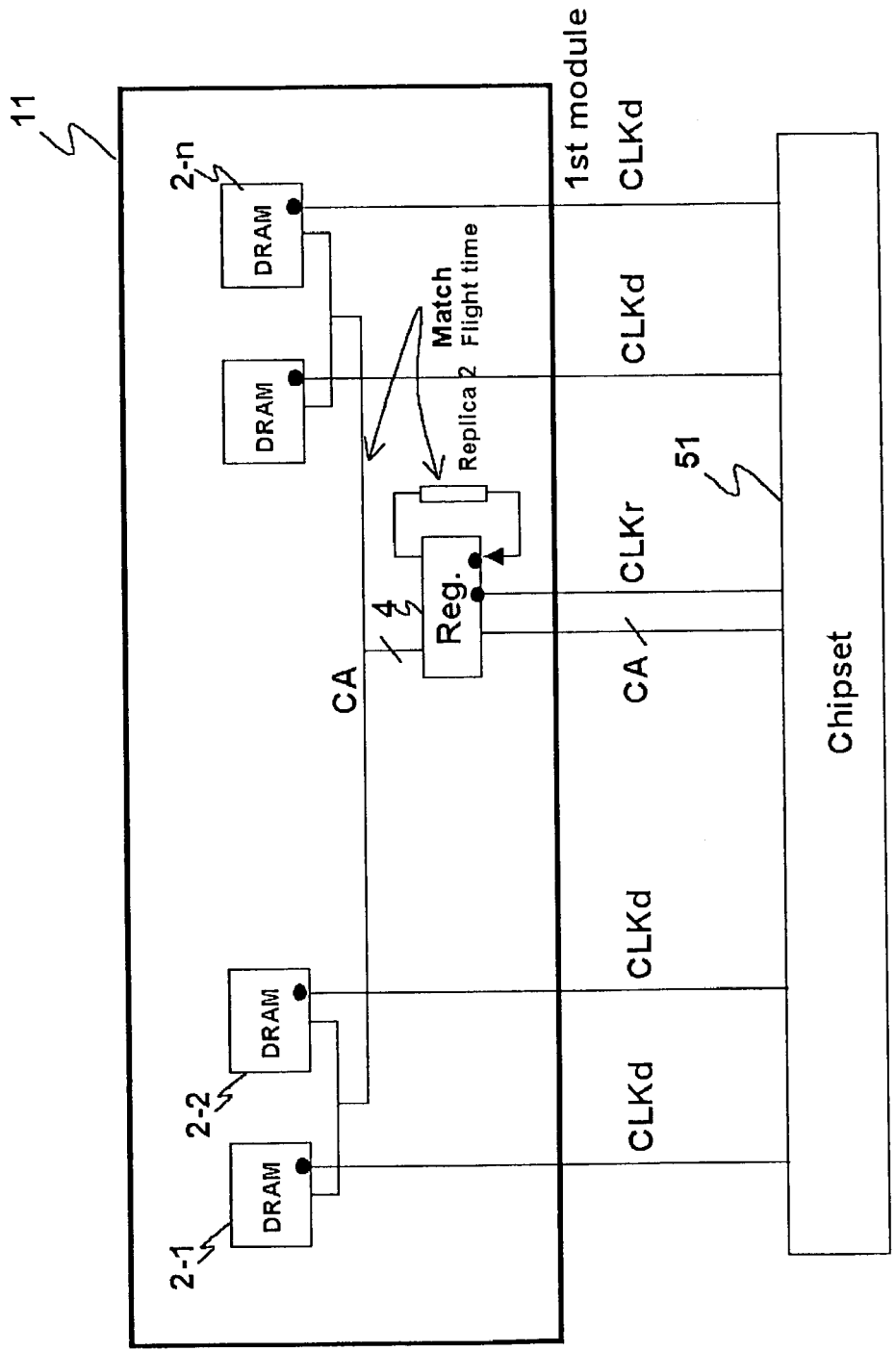
FIG. 11 shows an instance of a memory system according to a modification of the embodiment of the present invention.

FIG. 11 shows a modified embodiment of the memory system shown in FIG. 1. Referring to FIG. 11, no PLL is provided on the module 11. The clocks supplied to the DRAM 2-1 to 2-$n$ or to the register 4, that is n clock signal (CLKd), supplied to the DRAMs 2-1 to 2-$n$ and clock signal (CLKr) supplied to the register 4, are all supplied from the chip set 51. As in the embodiment of FIG. 1, the output timings from the chip set 51 are matched to one another so that the timings of the clocks will be matched to one another in the input sections of the DRAMs 2-1 to 2-$n$ and the register 4. Additionally, the propagation delay time of the clock signals from the chip set 51 to the register 4 and to the DRAMs 2-1 to 2-$n$ is designed to be in order. The register on the module 11 is constructed to be of the same structure as the register 4 of FIG. 1. Moreover, as in the embodiment of FIG. 1, the external replica (Replica2) of the register 4 is provided for timing control of the internal clock signal (intCLK) within the register 4 (see FIG. 2). The flight time of the second replica (Replica2) is designed to be equal to the flight time of the CA signal from the output of the register 4 to the inputs of the DRAM 2-1 to 2-$n$.

In the embodiment shown in FIG. 11, the clock signal (CLKd) for the DRAM 2 are also supplied from the chip set 51, so that the number of clock signal lines is larger than that in the embodiment shown in FIG. 1. This gives rise to an increased number of package pins of the chip set 51 and an increased number of pins of the module 11. Thus, if limitations are imposed on the number of pins, the number of the pins used for the power supply or grounding is necessarily decreased, as a result of which the return current cannot be positively supplied, or the power supply system remains unstable. In the high speed operation, the embodiment of FIG. 1 is appropriate.

In the embodiment of FIG. 11, the number of pins is increased, thus increasing the system cost.

As may be seen from comparison of the embodiment shown in FIG. 1 and FIG. 13, now standardized in the pertinent business circles, the same signals are used for interconnecting the chip set and the module.

That is, if the conventional system of FIG. 13 is to be increased in speed, it is sufficient to substitute the module 1 of the present embodiment of FIG. 1 for the conventional module 11.

In the embodiment shown in FIG. 11, in which the clock configuration differs, comprehensive design change is made beginning from the motherboard.

Thus, the embodiment of FIG. 1 has upward compatibility with respect to the conventional memory system, and can be improved significantly in performance by simple change from the conventional memory system.

Moreover, in the embodiment of FIG. 11, all clock signals (CLKd) supplied to the DRAMs 2-1 to 2-$n$ traverse the connectors of the module 11. For this reason, the clock signal(CLKd) is affected by the manufacture variations of the connector pins and the crosstalk at the connector pins, thus increasing the skew between the clock signals (CLKd), thus decreasing the timing margin.

In the embodiment of FIG. 1, only the clock signal (CLK) from the chip set 5 is supplied to the PLL 3. The skew is smaller than with the clock signal (CLKd) of FIG. 11.

In the embodiment of FIG. 11, there is provided no PLL, with the hierarchy of the PLL being smaller by one layer. Thus, there is the possibility of saving clock jitter by one stage and of reducing the cost of the module 11.

If, as described above, the PLL 3 is provided on the module 1, the DLL 4-5 is provided in the register 4-A and the timing of the internal clocks (intCLK) output by the DLL 4-5 and supplied to the clock input terminal of the second stage flip-flop 4-4 is controlled to control the output timing of the CA signal, it becomes possible to equate the margin of the setup time and that of the hold time for CA signal for the clock signals (CLKd) in the DRAMs 2-1 to 2-$n$. By controlling the delay time of the CA signal so that the setup time margin and the hold time margin of the CA signal for the internal clock signal (intCLK) of the flip-flop 4-4 will be of a positive sign, the setup time margin and the hold time margin of the CA signal with respect to the internal clock signal (intCLK) in the second flip-flop 4-4 in the register 4-A may be of a positive sign even if the frequency is changed.

Of course, the PLL 3 and the register 4 may be of one chip, or of a multi-chip module structure. If, in this case, the flight time of the clock signal (CLKd) from the register 4 to the DRAM 2-1 to 2-$n$ is equal to the flight time of the CA signal, the PLL may be omitted to provide a one-chip structure.

Figure 12:
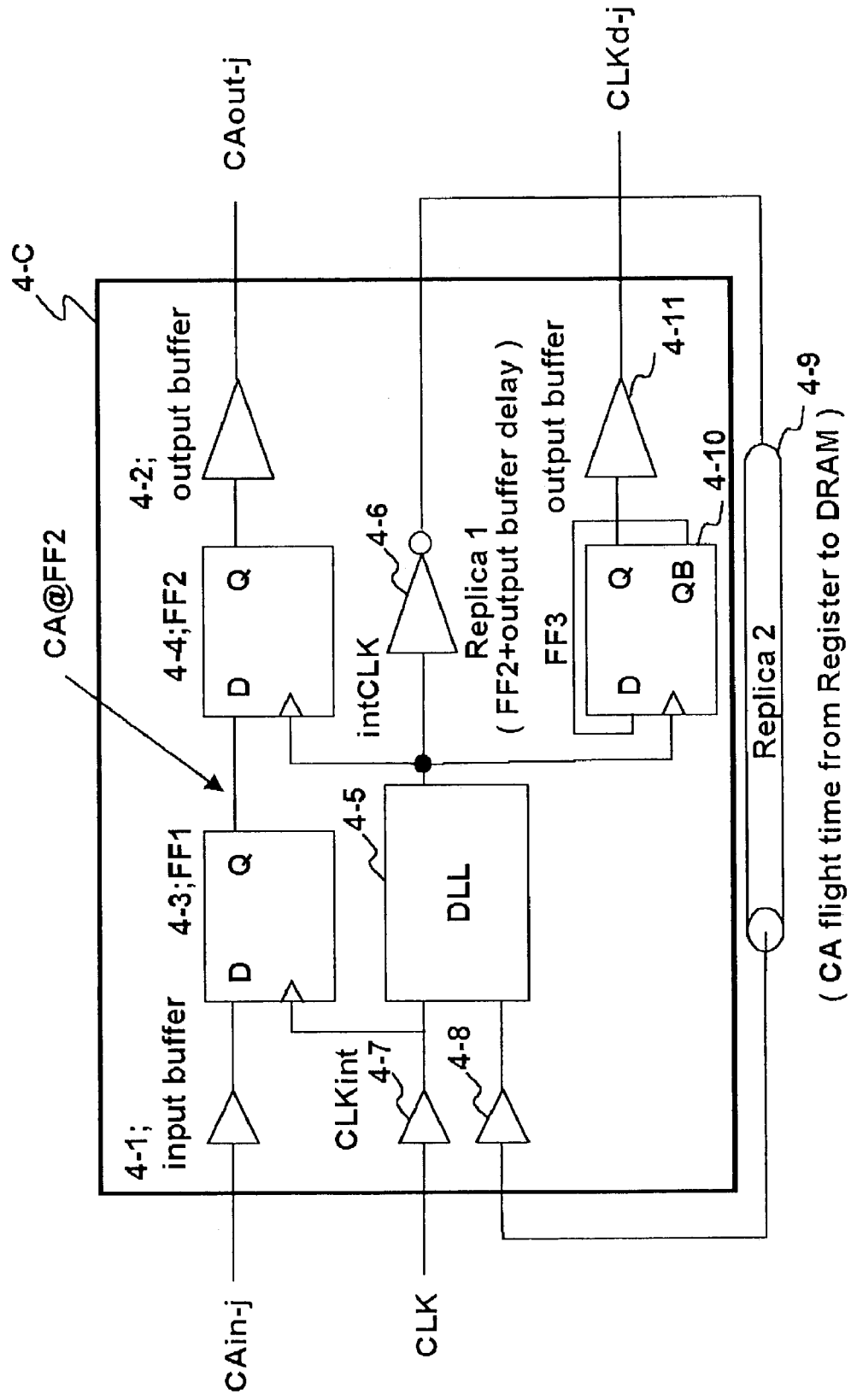
FIG. 12 depicts a register buffer comprised of the register and the PLL arranged into one chip.

FIG. 12 shows a modification of the present embodiment. In FIG. 12, this register 4-C differs from the register 4-A of FIG. 2 in that the register 4-C also outputs a clock signal (CLKd). That is, referring to FIG. 12, the register 4-C has a structure of FIG. 2 to which are added a third flip-flop 4-10 and an output buffer 4-11. An output (intCLK) of the DLL 4-5 is supplied to a third flip-flop 4-10 forming the frequency divider and is output via an output buffer 4-11. The register 4-C of the present modification may be in one chip together with the PLL.

A second embodiment of the present invention is now explained. The memory system is similar in structure to that shown in FIG. 1. The register 4, however, differs in structure.

Figure 7:
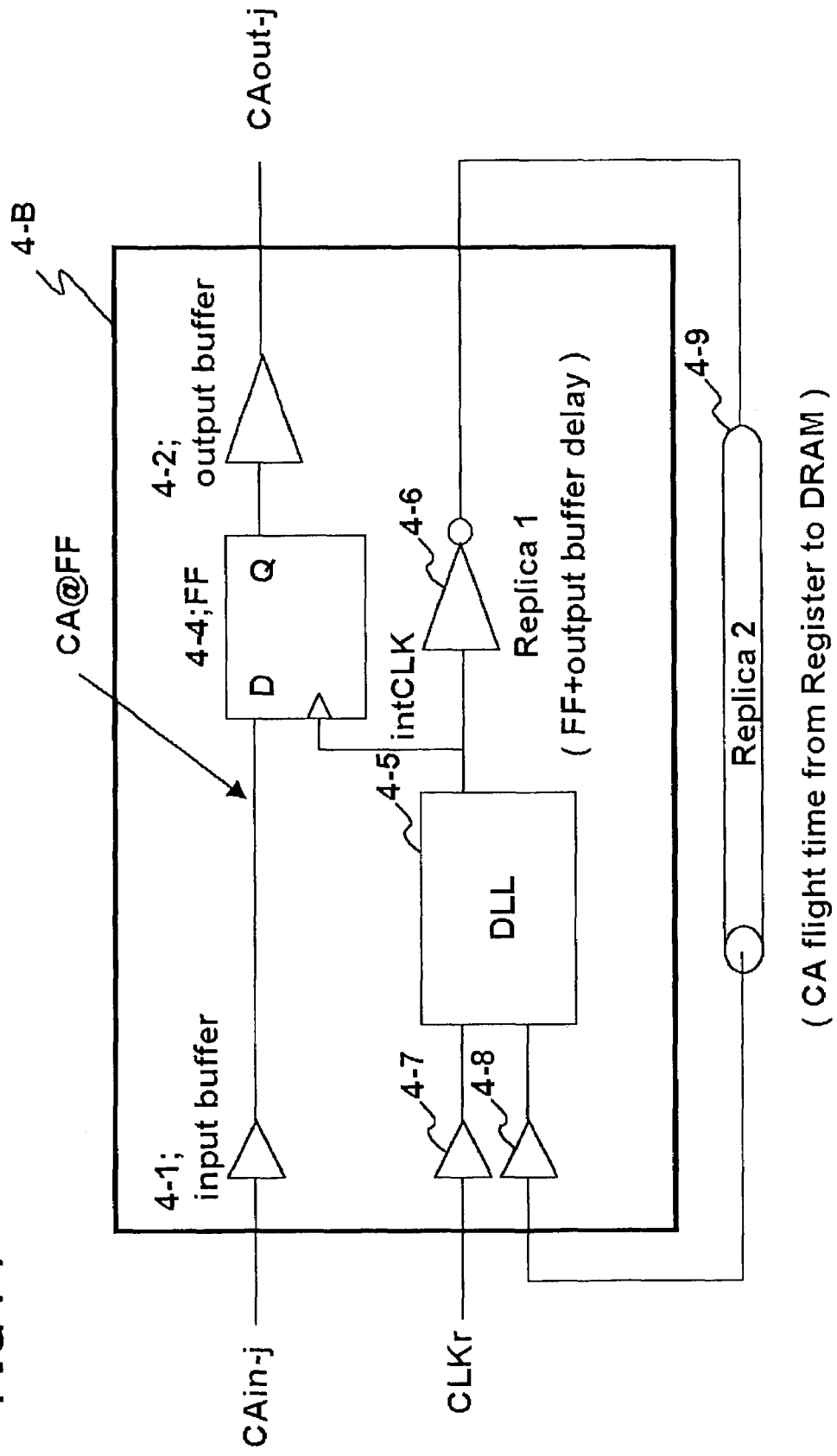
FIG. 7 shows the structure of a register according to a second embodiment of the present invention.

FIG. 7 shows the structure of the register 4-B of the second embodiment of the present invention. Referring to FIG. 7, the register 4-B differs from the register 4-A shown in FIG. 2 in not having the flip-flop 4-3. The register includes, in addition to the input buffer 4-1 and the output buffer 4-2, a flip-flop 4-4 for taking in the CA signal into the register and outputting the signal, based on the internal clock signal (intCLK), timing controlled by the clock signal (CLKr), a DLL 4-5 for generating an internal clock signal (intCLK), a first replica (Replica1) 4-6 for advancing the timing of the internal clock signal (intCLK) by clock signal (CLKr) and a second replica (Replica2) 4-9. This second replica (Replica2) 4-9 is provided outside the register 4-B. The external replica (Replica2) 4-9 is tuned to the flight time which is the time for the CA signal exiting the register 4B to reach the DRAM 2. The first replica (Replica1) 4-6 is tuned to the delay time which elapses since the internal clock (intCLK) enters the flip-flop 4-4 until the CA signal appears on an output pin of the register 4-B.

Figure 8:
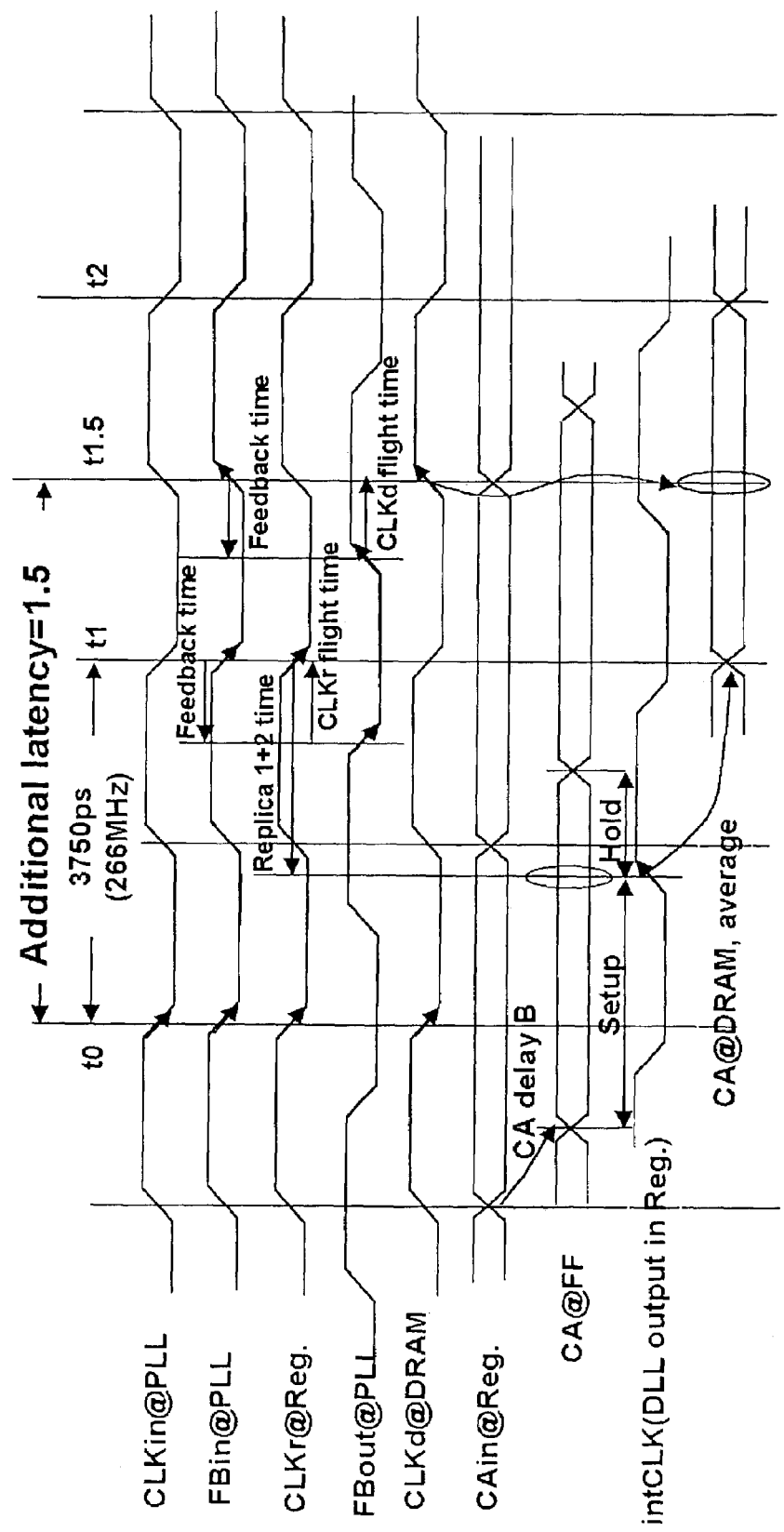
FIG. 8 is a timing chart in a 266 MHzCLK according to the second embodiment of the present invention.

FIG. 8 is a timing chart for illustrating the operation of the present embodiment in which the register 4-B of FIG. 7 is used as the register 4 of FIG. 1, with the clock frequency being 266 MHz. In the respective inputs to the PLL 3, DRAMs 2-1 to 2-$n$ and the register 4-B, the clock signal (CLK), that is
  clock input to the PLL 3 (CLKin@PLL),
  feedback input to the PLL 3 (FBin@PLL),
  clock input to the register 4-B (CLKr@Reg.) and
  clock input to the DRAM 2 (CLKd@DRAM)
are of the same phase, with the respective decay timings being in a mid portion of the CA signal (Cain@Reg.) at the input to the register 4-B (see for example t0 of FIG. 8).

The CA signal, which has reached the register 4-B from the chip set 5, gets to the flip-flop 4-4 over a delay time (CA delay B). The value of this delay time (CA delay A) is basically the delay time of the input buffer 4-1 and is subjected to variations due to manufacture tolerances and state of the using environments of the register 4-B. FIG. 8 shows the standard value of the delay time.

The CA signal (CA@FF), input to the flip-flop 4-4, is latched by the rising edge of the temporally advanced internal clock signal (intCLK) a time equal to the decay time of the first replica (Replica1) 4-6 plus the delay time of the second replica (Replica2) 4-9, by the DLL 4-5, with respect to the clock signal (CLKr) of the register input unit.

The first replica (Replica1) 4-6 is a replica of the delay time of the flip-flop 4-4 and the output buffer 4-2, while the second replica (Replica2) 4-9 is a replica of the flight time of the CA signal from the register output until the input to the DRAM 2. Thus, the CA signal, latched by the internal clock signal (intCLK), arrives at the DRAM 2 so that the rise of the clock signal (CLKd) will be in a mid portion of the CA signal at the input unit to the DRAM 2.

In actuality, the CA signal may arrive at the DRAM 2 faster or slower as compared to the state shown in FIG. 8, due to, for example, output variations of the CA signal at the register 4-B. However, insofar as the standard value is concerned, the timing position is as shown, that is, in the DRAM 2, the setup time margin and the hold time margin of the CA signal are equal to each other with respect to the clock signal (CLKd).

It is noted that, the time as from the decay of the clock signal (CLKr), by which the CA signal is taken into the register 4-B, until the rise of the clock signal (CLKd), by which the CA signal is taken into the DRAM 2, is a 1.5 clock period, so that the additional latency is 1.5.

The timing budget (Timingbudget) is now explained. FIG. 9 shows the timing budget (Timingbudget) of the setup time and the hold time of the CA signal with respect to the clock signal (CLKd) in the DRAM 2 of the present embodiment for 266 MHzCLK and 200 MHzCLK.

For 266 MHzCLK, the time equal to 1875 ps corresponding to one-half period (tCK/2) less CA access time variations of the register (CAAccesstimevariation) tQR, tS/tH as specification values of the setup time and the hold time of the DRAM 2, Δt, PLL, as specification values of the pin-to-pin skew (pintopinskew) of the PLL 3 and the jitter, flight time skew tSkew, CLKd of the clock signal on the module, tJ, CLKp which is the jitter of the clock signal input to the PLL 3, duty cycle error tDuty, CLK of the clock signal (CLK), flight time difference tFL between the clock signal (CLKr) and the clock signal (CLKd), skew Δ tPD of the CA signal in an input between DRAMs 2, and tSkew,PD of the flight time error between the second replica (Replica1) 4-9 and the flight time error CA becomes a margin tM of the setup time and the hold time of the CA signal with respect to the clock signal (CLKd) in the DRAM (see the equation (8)).

$$tM=tCK/2-(tQR+tS/tH+\Delta t,PLL+tSkew,CLKd+tJ,CLKp+tDuty,CLK+tFL+\Delta tPD+tSkew,P) \quad (8).$$

For 200 MHzCLK, the above basically holds. The margin is increased by a value equal to one half period (625 ps). Meanwhile, FIG. 9 is the same as FIG. 4 of the first embodiment described above.

The values of the respective items we have scrutinized are substituted to calculate the margin tM. Thus, for 266 MHz, both the setup time and the hold time are 162 ps.

For 200 MHzCLK, and for both the setup time and the hold time, tM=787 ps. That is, even if the operating frequency is changed, the margin for the setup time for the CA signal and that for the hold time for the CA signal with respect to the clock signal (CLKd) in the DRAM are equal to each other at all times so that a maximum value may be achieved.

FIG. 10 shows the timing budget (Timingbudget) of the setup time and the hold time of the CA signal with respect to the internal clock signal (intCLK) in the flip-flop 4-4 in the register 4-B of the present embodiment.

As to setup for 266 MHzCLK, the time of 5625 ps of 1.5 period less tJ, CLKp which is the jitter of the clock signal (CLK) input to the PLL 3, a duty cycle error tDuty,CLK of the clock signal (CLK), Δ t,PLL which is the specification value of the phase error of PLL 3, pin-to-pin skew and the jitter, tFLB which is an error between the delay time of the feedback loop of the PLL 3 and the flight time of the clock signal CLKr, tQ,CS of the CA signal output from the chip set 5, tCE,MB of the CA skew produced until the CA signal gets to the register 4-B from the chip set 5, CA delayB max which is the maximum value of the delay time of the input buffer 4-1 of the CA signal, tReplica1,2max which is the maximum, value of the delay time of the first replica (Replica1) and the second replica (Replica1), and setup time t setup of the flip-flop 4-4 (this setup time is [intrinsic setup time of the flip-flop 4-4]+[delay time difference of the input buffer 4-7 connected to DLL 4-5]+[jitter of DLL 4-5]+[distribution error of the internal clock signal (intCLK)])

becomes the margin tM of the setup time for the CA signal with respect to the internal clock signal (intCLK) in the flip-flop 4-4 in the register 4-B (see the following equation (9)):

$$tM=1.5CLK-(tJ,CLKp+tDuty,CLK+\Delta t,PLL+tFLFB+tQ,CS+tCE,MB+CadelayBmax+tReplica1,2max+tsetup) \quad (9).$$

As for hold for 266 MHzCLK, the time equal to the sum of CAdelayMmin as a minimum value of the delay time of the input buffer for CA 4-7 and tReplica1,2min which is the minimum value of the delay time of the first replica (Replica1) 4-6 and the second replica (Replica2) 4-9 less tJ,CLKp which is the jitter of the clock signal (CLK) input to the PLL 3, duty cycle error tDuty,CLK of the clock signal (CLK), Δ t,PLL which is the specification values of the phase error of the PLL 3, pin-to-pin skew and jitter, tFLFB of the delay time of the feedback loop of PLL 3 and the flight time error of the clock signal (CLKr), tQ,CS of the skew of the CA signal output by the chip set 5, tCE,MB of the CA skew produced until the signal reaches the register 4-B from the chip set 5, hold time thold of the flip-flop 4-4 (this hold time is [intrinsic hold time of the flip-flop 4-4]+[delay time difference of the input buffer 4-7 connected to the DLL 4-5]+[jitter of DLL 4-5]+[distribution error of the internal clock signal (intCLK)], and 1875 ps of one-half period, becomes the margin tM of the hold time of the CA signal with respect to the internal clock signal (intCLK) in the flip-flop 4-4 in the register (see the following equation (10)):

$$tM = (CadelayBmin) + tReplica1,2min) - (tJ,CLKp + tDuty,CLK + \Delta\ t,PLL + tFLFB + tQ,CS + tCE,MB + thold) - tCK/2 \quad (10).$$

By substituting the magnitudes of the respective items we have scrutinized, and by calculating the margin tM, the setup time margin and the hold time margin for 266 MHz are both 65 ps. For 200 MHzCLK, the setup time margin and the hold time margin are 940 ps and 90 ps, respectively.

It is noted that, for 266 MHzCLK, the maximum and minimum values of the [first replica (Replica1) 4-6]+[second replica (Replica2) 4-9] are 3000 ps and 2150 ps, which are faster than the values indicated in FIG. 6. That is, if the value of the [first replica (Replica1) 4-6]+[second replica (Replica1) 4-9] is smaller than those of the first embodiment, the present embodiment with the additional latency=1.5 may be used.

For 200 MHzCLK, the maximum and minimum values of the [first replica (Replica1) 4-6]+[second replica (Replica2) 4-9] are 4000 ps and 2800 ps, which are slower than the corresponding values for 266 MHz. That is, for the lower frequency, control is so made that the speed of the output buffer 4-2 will be retarded. The speed of the output buffer 4-2 is decreased by varying the current driving capability (transconductance) of a driver adapted for driving an output of the output buffer 4-2.

This control is by providing a parallel connection of an inverter array of a longer length and an inverter array of a short length across the output buffer 4-2 and the flip-flop 4-4 and by switching to one of these arrays depending on the frequency in use, as shown in FIG. 7.

An inverter sequence, not shown, is also provided between the input buffer 4-1 for the CA signal and a data input terminal D of the flip-flop 4-4 in FIG. 7 to add the delay time α, in order that the totality of the margins will be of the positive sign. The maximum and minimum values of the delay time of the inverter array are set to 800 ps and to 550 ps, respectively.

By switching the delay time of for example the replica1 associated with the delay time of the output buffer 4-2 in the register 4-B, and by controlling the delay time of CA, it is possible to provide a register capable of coping with both of 266 MHz and 200 MHz, with the additional latency of 1.5.

Alternatively, the delay time α may be reduced to zero and the time so afforded may be added to the [first replica (Replica1) 4-6]+[second replica (Replica1) 4-9]. That is, the maximum and minimum values of the [first replica (Replica1) 4-6]+[second replica (Replica1) 4-9] may be set to 3800 ps and 2700 ps for 266 MHzCLK, respectively, whereas, for 200 MHzCLK, the maximum and minimum values of the [first replica (Replica1) 4-6]+[second replica (Replica2) 4-9] may be set to 4800 ps and 3350 ps, respectively.

As described previously, by providing the PLL and the DLL on the module and within the register, respectively, and by controlling the clocks of the flip-flop by controlling the timing of the internal clock signal (intCLK) output from the DLL, thereby controlling the output timing of the CA signal, it is possible to equate the setup time margin and the hold time margin of the CA signal with respect to the clock signal (CLKd) in the DRAM 2. Additionally, by switching between the delay time of the output buffer 4-2 and the delay time of the associated second replica 4-9 within the register, depending on the frequency, at least, so that the setup time margin and the hold time margin of the CA signal with respect to the internal clock signal (intCLK) of the flip-flop will be of the plus sign, the setup time margin and the hold time margin of the CA signal with respect to the internal clock signal (intCLK) in the flip-flop in the register 4-B may be of the plus sign, even if the frequency is changed. The PLL and the register 4-B may be of one chip or may be in the form of a multi-chip module.

Although the present invention has been explained in connection with the above-described respective embodiments, the present invention is not limited to the construction of the above-described embodiments and may encompass various modifications or corrections that may be within the reach of those ordinarily skilled in the art within the scope of the invention as defined in the appended claims.

The meritorious effects of the present invention are summarized as follows.

The following meritorious effects may be achieved in accordance with the present invention described above.

The first meritorious effect of the present invention is that the timings of the various clocks in the input sections to the PLL, registers and the input sections to the DRAM on the module are matched to one another, the DLL is provided in the register, the output timing of the CA signal from the register is controlled and the setup timing margin and the hold time margin of the CA signal are equated to each other for the clock signal (CLKd) with the additional latency in the DRAM being 1.5 to 2.0, such that the operation for 266 MHzCLK is also possible.

If the system is used for both 266 MHz and for 200 MHz, control is made for retarding the timing of the CA signal input to the flip-flop supplied with the internal clock signal (intCLK) determining the CA signal output timing from the register, or for switching between the replica provided in the register and the output unit associated with the replica depending on the frequency being used, by taking the timing budget (Timingbudget) table into account, so that these frequencies can be coped with simply by providing one sort of the module and one sort of the register.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A memory system comprising a chip set and a module that includes a phase locked loop circuit, a register and a memory device, wherein
    said chip set supplies a first clock signal (CLK) and a command/address signal (termed CA signal) for said memory device to said module;
    said phase locked loop circuit receives said first clock output from said chip set to output a second clock signal (CLKd) supplied to said memory device at least;
    said register receives a third clock signal (CLKr) output from said phase locked loop circuit or said chip set to latch the CA signal output from said chip set to output the latched CA signal as a CA signal to be supplied to said memory device; and
    said memory device receives said second clock signal (CLKd) to latch the CA signal output from said register based on said second clock signal (CLKd),
    wherein
    the timings of the clock signals, input to respective clock input sections of said phase locked loop circuit, said memory device and the register are matched to one another, and wherein
said register includes:
a flip-flop for determining the output timing of said CA signal based on an internal clock signal (intCLK) generated from said third clock signal (CLKr) supplied to said register; and
timing controlling means for temporally advancing the timing of the internal clock signal (intCLK) supplied to said flip-flop with respect to the timing of said third clock signal (CLKr) at the input section of said register by the sum of delay time since the internal clock signal (intCLK) are input to said flip-flop until the register outputs the CA signal and the delay time since the register outputs said CA signal until said CA signal reaches said memory device,
said timing controlling means controlling an output timing of the CA signal from said register so that setup time margin and hold time margin of the CA signal with respect to said second clock signal in said memory device are equal to each other.

2. The memory system as defined in claim 1, wherein
said register includes, as said timing controlling means, a delay locked loop circuit (DLL) and a first replica in a register;
a second replica is provided outside said register;
said first replica and said second replica form a feedback loop of said delay locked loop circuit;
said third clock signal (CLKr) supplied to said register is supplied to a first input terminal of said delay locked loop circuit,
a signal from said feedback loop is supplied to a second input terminal of said delay locked loop circuit;
delay control is made in said delay locked loop circuit so that the signals input to said first and second input terminals of said delay locked loop circuit are in phase with each other; and
an output of said delay locked loop circuit is supplied as said internal clock signal (intCLK) to said flip-flop.

3. The memory system as defined in claim 1, wherein
the time interval as from the transition timing of said third clock signal for taking in the CA signal from said chip set to said register until the transition timing of a second clock signal taking in the CA signal from said register to said memory device is 1.5 or 2 times the clock period or longer.

4. The memory system as defined in claim 1, wherein
said phase locked loop circuit and said register are integrated on the same chip or formed as a multi-chip module.

5. The memory system as defined in claim 1, wherein
the clock operating frequency is 200 MHz or higher.

6. The memory system as defined in claim 1, wherein
the memory system includes means for delaying the timing of the CA signal input to said flip-flop of said register so that the setup time margin and the hold time margin of the input CA signal with respect to said internal clock (intCLK) are of a positive sign when the clocked operation is to be performed in at least both a first frequency and a second frequency, or for switching between a first replica provided in said register and an output unit associated with said first replica depending on the clock frequency being used.

7. The memory system as defined in claim 6, wherein
the first frequency band and the second frequency band forming the clock operating frequency are composed of respective different frequencies not less than 200 MHz.

8. A module including a phase locked loop circuit, a register and a memory device, wherein
the module receives a first clock signal (CLK) and a command/address signal (termed CA signal) supplied from a chip set outside the module;
said phase locked loop circuit receives said first clock signal to output a second clock signal (CLKd) to be supplied at least to said memory device;
said register receives a third clock signal (CLKr) output from said phase locked loop circuit or said chip set, and latches said CA signal supplied from said chip set based on said third clock signal (CLKr) to output the latched CA signal as a CA signal to be supplied to said memory device; and
said memory device receives said second clock signal (CLKd) to latch the CA signal output from said register based on said second clock signal (CLKd),
wherein
the clock signals, input to the clock input sections of said phase locked loop circuit, said memory device and the register, are matched in timing to one another, and
wherein
said register includes:
a flip-flop for determining the output timing of said CA signal based on an internal clock signal (intCLK) generated from said third clock signal (CLKr) input to said register; and
timing controlling means for temporally advancing the timing of the internal clock signal (intCLK) supplied to said flip-flop with respect to the timing of said third clock signal (CLKr) at the input unit to said register by the sum of delay time since the internal clock signal (intCLK) is input to said flip-flop until the register outputs the CA signal and the delay time since the register outputs said CA signal until said CA signal reaches said memory device,
said timing controlling means controlling an output timing of the CA signal from said register so that setup time margin and hold time margin of the CA signal with respect to said second clock signal in said memory device are equal to each other.

9. The module as defined in claim 8, wherein
said register includes, as said timing controlling means, a delay locked loop circuit (DLL), and a first replica;
a second replica is provided outside said register;
said first replica and the second replica form a feedback loop of said delay locked loop circuit (DLL),
said third clock signal (CLKr) input to said register is supplied to a first input terminal of said delay locked loop circuit,
a signal from said feedback loop is supplied to a second input terminal of said delay locked loop circuit (DLL),
delay control is executed said delay locked loop circuit so that the signals input to said first and second input terminals of said delay locked loop circuit are in phase with each other; and
an output of said delay locked loop circuit is supplied as said internal clock signal (intCLK) to said flip-flop.

10. The module as defined in claim 8, wherein
the time interval as from the transition timing of the third clock signal taking in the CA signal from said chip set to said register until the transition timing of the second clock signal taking in the CA signal from said register to said memory device is 1.5 or 2 times the clock period or longer.

11. The module as defined in claim 8, wherein
said phase locked loop circuit and said register are integrated on the same chip or formed as a multi-chip module.
12. The module as defined in claim 8, wherein
the clock operating frequency is 200 MHz or higher.
13. The module as defined in claim 8, wherein
the module includes means for delaying the timing of the CA signal input to said flip-flop of said register so that the setup time margin and the hold time margin of the input CA signal with respect to said internal clock signal (intCLK) are of a positive sign, when the clocked operation is to be performed in both a first frequency and a second frequency at least, or for switching between said first replica provided in said register and an output unit associated with said first replica depending on the clock frequency being used.
14. The module as defined in claim 13, wherein
the first frequency band and the second frequency band forming the clock operating frequency are composed of respective different frequencies not less than 200 MHz.
15. A register mounted on a module along with a phase locked loop circuit and a memory device, wherein
the module receives a first clock signal (CLK) and a command/address signal (termed CA signal) supplied from a chip set outside the module;
said phase locked loop circuit receives said first clock signal to output a second clock signal (CLKd) supplied to said memory device at least;
said memory device receives said second clock signal (CLKd) to latch the CA signal output from said register based on said second clock signal (CLKd); and
the register receives a third clock signal (CLKr) output from said phase locked loop circuit or said chip set to latch said CA signal supplied from said chip set based on said third clock signal (CLKr) to output the latched CA signal to be supplied to said memory device,
wherein
the third clock signal, input to the clock input unit of the register, are matched in timing to the clock signal input to clock input sections of said phase locked loop circuit and said memory device, and
wherein
the register includes:
a flip-flop for determining the output timing of said CA signal based on an internal clock signal (intCLK) generated from said third clock signal (CLKr); and
timing controlling means for temporally advancing the timing of the internal clock signal (intCLK) supplied to said flip-flop with respect to the timing of said third clock signal (CLKr) at the input unit to said register by the sum of delay time since the internal clock signal (intCLK) are input to said flip-flop until the register outputs the CA signal and the delay time since the register outputs said CA signal until said CA signal reaches said memory device,
said timing controlling means controlling an output timing of the CA signal from said register so that setup time margin and hold time margin of the CA signal with respect to said second clock signal in said memory device are equal to each other.
16. The register as defined in claim 15, wherein
the register includes, as said timing controlling means, a delay locked loop circuit (DLL), and a first replica;
a second replica is provided outside said register;
said first replica and the second replica form a feedback loop of said delay locked loop circuit (DLL), said third clock signal (CLKr) input to said register is supplied to a first input terminal of said delay locked loop circuit,
a signal from said feedback loop is input to a second input terminal of said delay locked loop circuit,
delay control is made in said delay locked loop circuit so that the signals input to said first and second input terminals of said delay locked loop circuit are in phase with each other; and
an output of said phase delay locked loop circuit is supplied as said internal clock signal (intCLK) to said flip-flop.
17. The register as defined in claim 15, wherein
the time interval as from the transition timing of said third clock signal until the transition timing of said second clock signal taking in the CA signal from said register to said memory device is 1.5 or 2 times the clock period or longer.
18. The register as defined in claim 15, wherein
the register is integrated along with the phase delay locked loop circuit on the same chip or formed as a multi-chip module.
19. The register as defined in claim 15, wherein
the clock operating frequency is 200 MHz or higher.
20. The register as defined in claim 15, wherein
the register includes means for delaying the timing of the CA signal input to said flip-flop so that the setup time margin and the hold time margin of the input CA signal with respect to said internal clock (intCLK) are of a positive sign when the clocked operation is to be performed in both a first frequency and a second frequency at least, or for switching between a first replica provided in said register and an output unit associated with said first replica depending on the clock frequency being used.
21. The register as defined in claim 20, wherein
the first frequency band and the second frequency band forming the clock operating frequencies are composed of respective different frequencies not less than 200 MHz.
22. A register mounted on a module having a memory device, wherein a clock signal and command/address signal (termed CA signal) for said memory device are supplied from a chip set outside said module to said module,
wherein
said CA signal is latched based on a timing-controlled internal clock signal generated from a clock signal from outside the register to generate and output a CA signal for said memory device,
wherein
said register comprises:
a first input buffer receiving at an input terminal, said CA signal supplied from said chip set;
a second input buffer receiving at an input terminal, a clock signal supplied from outside the register;
a first flip-flop having a data input terminal connected to an output terminal of said first input buffer and having a clock signal terminal connected to an output terminal of said second input buffer, said first flip-flop sampling the signal supplied to said data input terminal, based on a transition of the clock signal supplied to said data input terminal, to output the sampled signal at a data output terminal;
a delay locked loop circuit receiving at a first input terminal, a clock signal output from said second input buffer;

a second flip-flop having a data input terminal connected to a data output terminal of said first flip-flop and having a clock signal terminal connected to an output terminal of said delay locked loop circuit, said second flip-flop sampling the signal supplied to said data input terminal based on a transition of the internal clock signal supplied from an output terminal of said delay locked loop circuit to said data input terminal to output the sampled signal at a data output terminal;

a first output buffer having an input terminal connected to a data output terminal of said second flip-flop to output the CA signal from an output terminal to a memory device outside the register; and a first replica having an input terminal connected to an output terminal of said delay locked loop circuit to delay a signal input to said input terminal by a sum of the delay time of said second flip-flop and the delay time of said output buffer to output the resulting signal;

the signal output from said first replica being supplied to a second replica provided outside the register, so as to be delayed by a time corresponding to the flight time until said CA signal is output from the output terminal of said output buffer to reach said memory device, the register further including a third input buffer having an input terminal for receiving the clock signal output from said second replica, said third input buffer having an output terminal connected to a second input terminal of said delay locked loop circuit;

delay control being made in said delay locked loop circuit so that the signals input to said first and second input terminals of said delay locked loop are in phase with each other.

23. The register as defined in claim 22, further comprising
a circuit supplied with an internal clock signal output from said delay locked loop circuit to generate a clock signal for said memory device; and
a second output buffer for outputting the generated clock signal at an output terminal.

24. The register as defined in claim 22, further comprising
a delay circuit between the data output terminal of said first flip-flop and the data input terminal of said second flip-flop, with the delay time of the delay circuit being selectable to respective different values;
said delay circuit selecting one delay time associated with one of plural clock operating frequencies which is in use.

25. The register as defined in claim 22, further comprising
a delay circuit between the data output terminal of said second flip-flop and the input terminal of said output buffer, with the delay time of the delay circuit being selectable to respective different values;
said delay circuit selecting one delay time associated with one of plural clock operating frequencies which is in use.

26. The register as defined in claim 22, wherein
the delay time of said first output buffer is variable; and wherein
said first output buffer selects one delay time associated with one of plural clock operating frequencies which is in use.

27. The register as defined in claim 26, wherein
the delay time of said first replica can be switched between plural values; and wherein
the delay time of said first replica can be switched depending on the delay time of said first output buffer.

28. The register as defined in claim 22, wherein
the delay time of said first replica and/or said second replica is variable; and wherein
said first replica and/or said second replica selects one delay time associated with one of plural clock operating frequencies which is in use.

29. The register as defined in claim 22, wherein
the clock signal supplied to said second input buffer of said register from outside the register is supplied from a phase locked loop circuit loaded on said module, said phase locked loop circuit being supplied with said clock signal from said chip set; or wherein
the clock signal is directly supplied from said chip set.

30. The register as defined in claim 22, wherein
the timing of the clock signal (CLKd) input to the memory device is matched to the timing of the clock signal (CLKr) input to the register at input sections thereof; and wherein
the timing of transition of the internal clock signal supplied from the output terminal of the delay locked loop circuit to said second flip-flop is temporally advanced with respect to the timing of said clock signal (CLKr) at the input unit to the register by the sum of delay time since the internal clock signal are input to said second flip-flop until the register outputs the CA signal and the delay time since the register outputs said CA signal until said CA signal reaches said memory device, an output timing of the CA signal from said register being controlled so that setup time margin and hold time margin of the CA signal with respect to said clock signal (CLKd) in said memory device are equal to each other.

31. A module including a phase locked loop circuit, the register as defined in claim 22 and said memory device; wherein
said phase locked loop circuit receives a clock signal output from a chip set outside of the module to output the clock signal (CLKd) to said memory device and/or the clock signal (CLKr) supplied to said register;
said register receives the clock signal (CLKr) output from said phase locked loop circuit or from said chip set to latch said CA signal supplied from said chip set based on said clock signal (CLKr) to output the latched CA signal as a CA signal to be supplied to the memory device; and
said memory device receives the clock signal (CLKd) supplied to said memory device to latch the CA signal output from said register.

32. A register loaded on a module having a memory device, wherein
a clock signal and a command/address signal (termed CA signal) for said memory device are supplied from a chip set outside said module, to said module,
wherein
said CA signal is latched based on a timing-controlled internal clock signal input from outside the register to generate and output said CA signal for said memory device, and
wherein
said register comprises:
a first input buffer receiving at an input terminal, said CA signal supplied from said chip set;
a second input buffer receiving at an input terminal, a clock signal supplied from outside the register;
a delay locked loop circuit receiving at a first input terminal, a clock signal supplied from said second input buffer;

a flip-flop having a clock signal terminal connected to an output terminal of said delay locked loop circuit and having a data input terminal connected to an output terminal of said first input buffer, said flip-flop sampling the signal supplied to said data input terminal based on the transition of the internal clock signal supplied from the output terminal of said delay locked loop circuit to said clock signal terminal to output the sampled signal at a data output terminal;

a first output buffer having an input terminal connected to a data output terminal of said flip-flop and adapted for outputting the CA signal from an output terminal to a memory device outside said register;

a first replica having an input terminal connected to an output terminal of said delay locked loop circuit and adapted to delay the clock signal input to said input terminal a time corresponding to the sum of the delay time of said flip-flop and the delay time of said output buffer to output the resulting signal at an output terminal;

the signal output from said first replica being input to a second replica provided outside the register and being delayed in said second replica a time corresponding to the flight time during which said CA signal is output from the output terminal of said output buffer to reach the memory device; and a third input buffer having an input terminal for receiving the clock signal output from said second replica;

an output terminal of said third input buffer being connected to a second input terminal of said delay locked loop circuit;

said delay locked loop circuit controlling the signal delay so that the signals input to said first and second input terminals of said delay locked loop circuit are in phase with each other.

33. The register as defined in claim 32, further comprising
a delay circuit between the first input buffer and the data input terminal of said flip-flop, with the delay time of the delay circuit being selectable to respective different values;
said delay circuit selecting one delay time associated with one of plural clock operating frequencies which is in use.

34. The register as defined in claim 32, further comprising
a delay circuit between the data output terminal of said flip-flop and the input terminal of said output buffer, with the delay time of the delay circuit being selectable to respective different values;
said delay circuit selecting one delay time associated with one of plural clock operating frequencies which is in use.

35. The register as defined in claim 32, wherein
the timing of the clock signal (CLKd) input to the memory device is matched to the timing of the clock signal (CLKr) input to the register at input sections thereof; and wherein the timing of transition of the internal clock signal supplied from the output terminal of said delay locked loop circuit to the clock signal terminal of said flip-flop is temporally advanced with respect to the timing of said clock signal (CLKr) at the input unit to the register by the sum of delay time since the internal clock signal is input to said second flip-flop until the register outputs the CA signal and the delay time since the register outputs said CA signal until said CA signal reaches said memory device, an output timing of the CA signal from said register being controlled so that setup time margin and hold time margin of the CA signal with respect to said clock signal (CLKd) in said memory device are equal to each other.

36. The register as defined in claim 32, wherein
the delay time of said first output buffer is variable; and wherein
said first output buffer selects one delay time associated with one of plural clock operating frequencies which is in use.

37. The register as defined in claim 36, wherein
the delay time of said first replica can be switched between plural values; and wherein
the delay time of said first replica can be switched depending on the delay time of said first output buffer.

38. The register as defined in claim 32, wherein
the delay time of said first replica and/or said second replica is variable; and wherein
said first replica and/or said second replica selects one delay time associated with one of plural clock operating frequencies which is in use.

39. The register as defined in claim 32, wherein
the clock signal supplied to said second input buffer of said register from outside the register is supplied from a phase locked loop circuit loaded on said module, said phase locked loop circuit being supplied with said clock signal from said chip set; or wherein
the clock signal is directly supplied from said chip set.

40. A module including a phase locked loop circuit, the register as defined in claim 32 and said memory device; wherein
said phase locked loop circuit receives a clock signal output from a chip set outside of the module to output the clock signal (CLKd) to said memory device and/or the clock signal (CLKr) supplied to said register;
said register receives the clock signal (CLKr) output from said phase locked loop circuit or from said chip set to latch said CA signal supplied from said chip set based on said clock signal (CLKr) to output the latched CA signal as a CA signal to be supplied to the memory device; and
said memory device receives the clock signal (CLKd) supplied to said memory device to latch the CA signal output from said register.

* * * * *